(12) United States Patent
Oooka et al.

(10) Patent No.: US 8,907,207 B2
(45) Date of Patent: Dec. 9, 2014

(54) SOLAR CELL MODULE

(75) Inventors: Haruhi Oooka, Kawasaki (JP); Mitsunaga Saito, Inzai (JP); Masahiro Hosoya, Okegawa (JP); Hiroki Iwanaga, Yokohama (JP); Michihiko Inaba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 456 days.

(21) Appl. No.: 13/422,127

(22) Filed: Mar. 16, 2012

(65) Prior Publication Data

US 2012/0234389 A1    Sep. 20, 2012

(30) Foreign Application Priority Data

Mar. 17, 2011    (JP) ................... 2011-059905

(51) Int. Cl.
  *H01L 31/0203* (2014.01)
  *H01L 51/44* (2006.01)
  *H01L 27/30* (2006.01)

(52) U.S. Cl.
  CPC ............ *H01L 51/447* (2013.01); *H01L 27/304* (2013.01); *Y02E 10/549* (2013.01)
  USPC .......................................... 136/259; 136/252

(58) Field of Classification Search
  USPC ................................................. 136/259, 252
  See application file for complete search history.

(56) References Cited

U.S. PATENT DOCUMENTS

| | | | | |
|---|---|---|---|---|
| 4,053,327 A | * | 10/1977 | Meulenberg, Jr. | 136/256 |
| 4,104,083 A | * | 8/1978 | Hirano | 136/259 |
| 4,479,027 A | * | 10/1984 | Todorof | 136/249 |
| 4,711,972 A | * | 12/1987 | O'Neill | 136/246 |
| 5,240,510 A | * | 8/1993 | Goldade et al. | 136/259 |
| 5,284,525 A | * | 2/1994 | Saito et al. | 136/256 |
| 5,646,397 A | * | 7/1997 | Wenham et al. | 250/216 |
| 6,350,945 B1 | * | 2/2002 | Mizuno | 136/246 |
| 2012/0055536 A1 | | 3/2012 | Saito et al. | |

FOREIGN PATENT DOCUMENTS

| | | |
|---|---|---|
| JP | 2-42450 | 3/1990 |
| JP | 07-066439 | 3/1995 |
| JP | 2005-294787 | 10/2005 |
| JP | 2008-141143 | 6/2008 |

OTHER PUBLICATIONS

First Office Action of Reasons for Rejection for Patent Application No. 2011-059905 Dated Apr. 2, 2013, 4 pgs.
Niggemann et al, Light Trapping in Organic Solar Cells, Phys. Stat. Sol. (a) 205, No. 12, pp. 2862-2874, 2008.

* cited by examiner

*Primary Examiner* — Golam Mowla
(74) *Attorney, Agent, or Firm* — Amin, Turocy & Watson, LLP

(57) ABSTRACT

A solar cell module according to an embodiment includes a solar cell device and a support structure supporting the solar cell device. The solar cell device is a belt-like solar cell device including first portions arranged in one direction such that major surfaces thereof face each other, and a second portion interposed between the first portions. The edges of the first portions that correspond to a pair of long sides of the solar cell device are parallel to each other. Two adjacent first portions incline forwardly and backwardly with respect to the one direction. The second portion includes one or more planar or curved surfaces to connect the two adjacent first portions to each other.

19 Claims, 19 Drawing Sheets

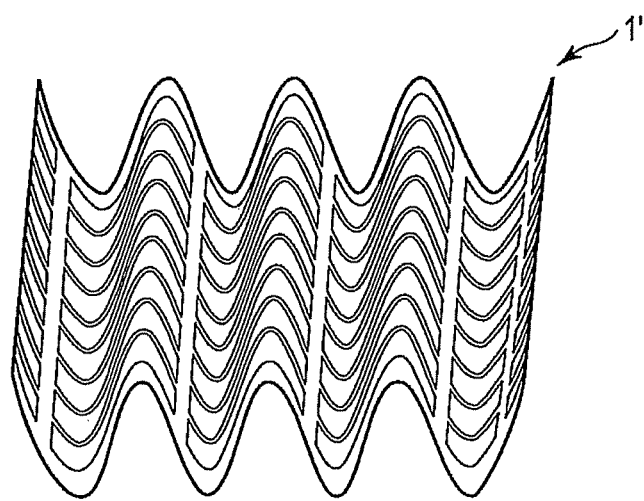
F I G. 5
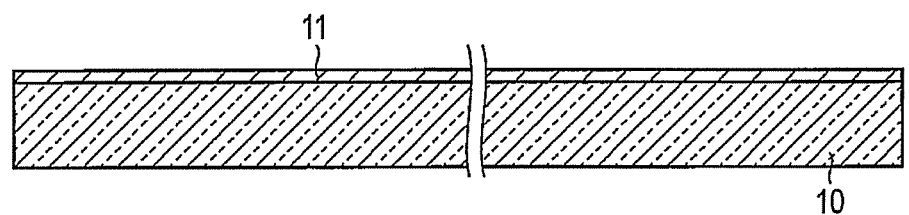
F I G. 6
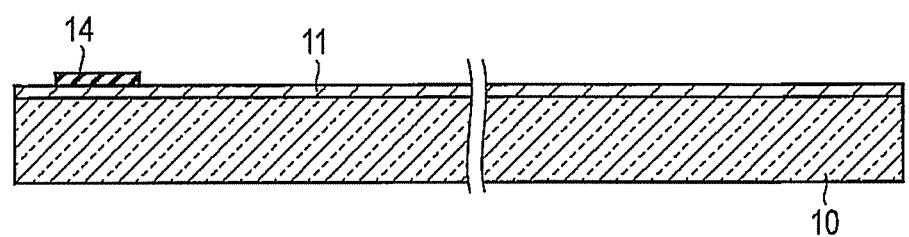
F I G. 7

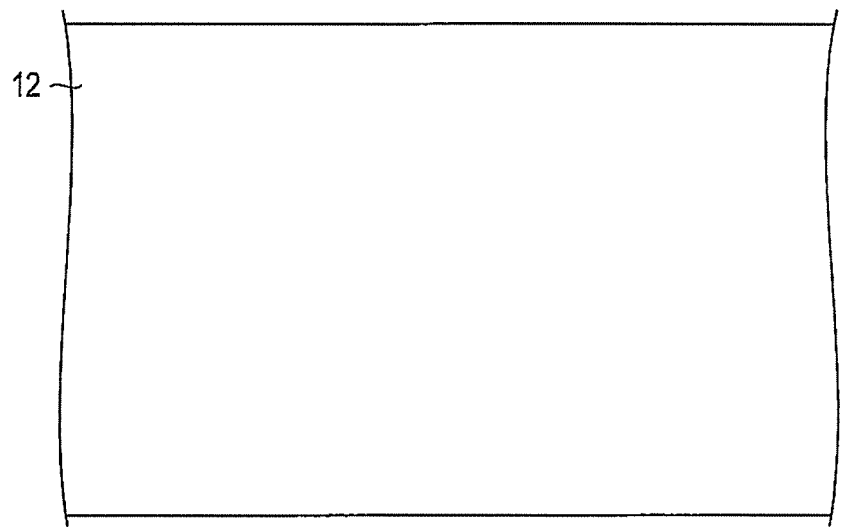
F I G. 11
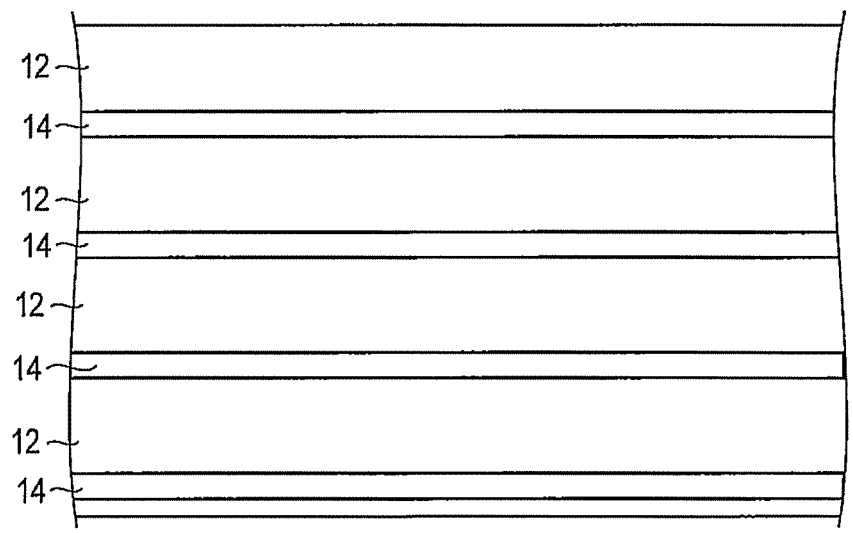
F I G. 12

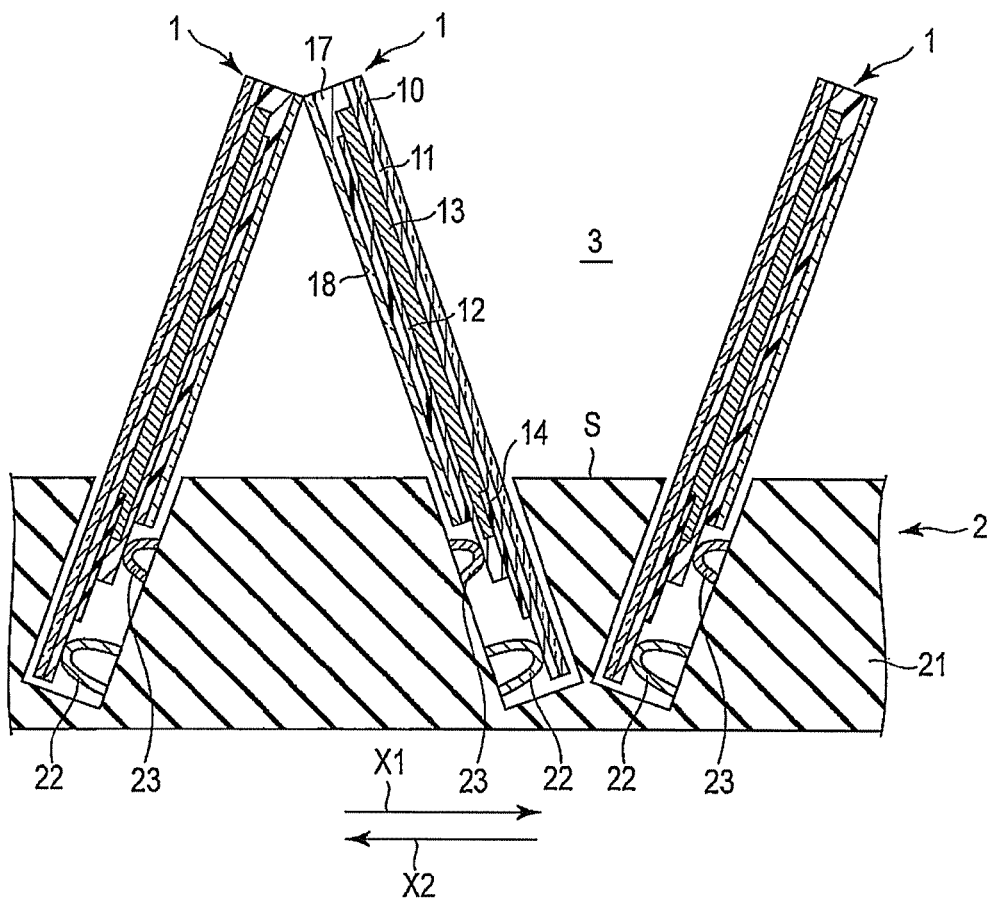
F I G. 20
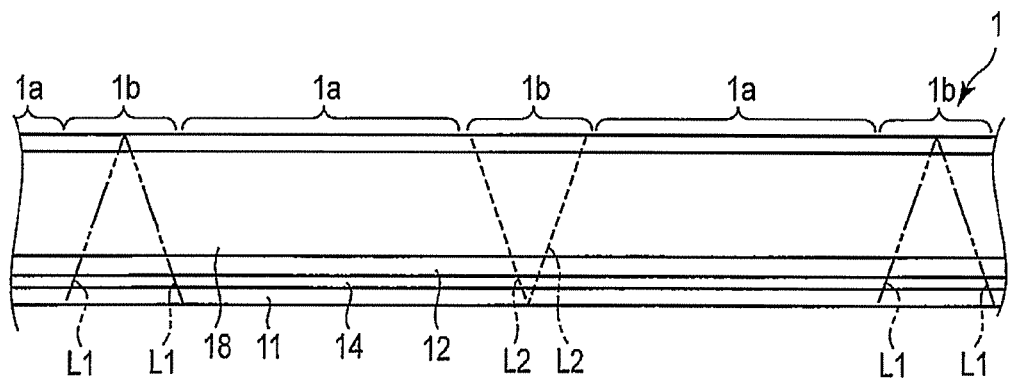
F I G. 21

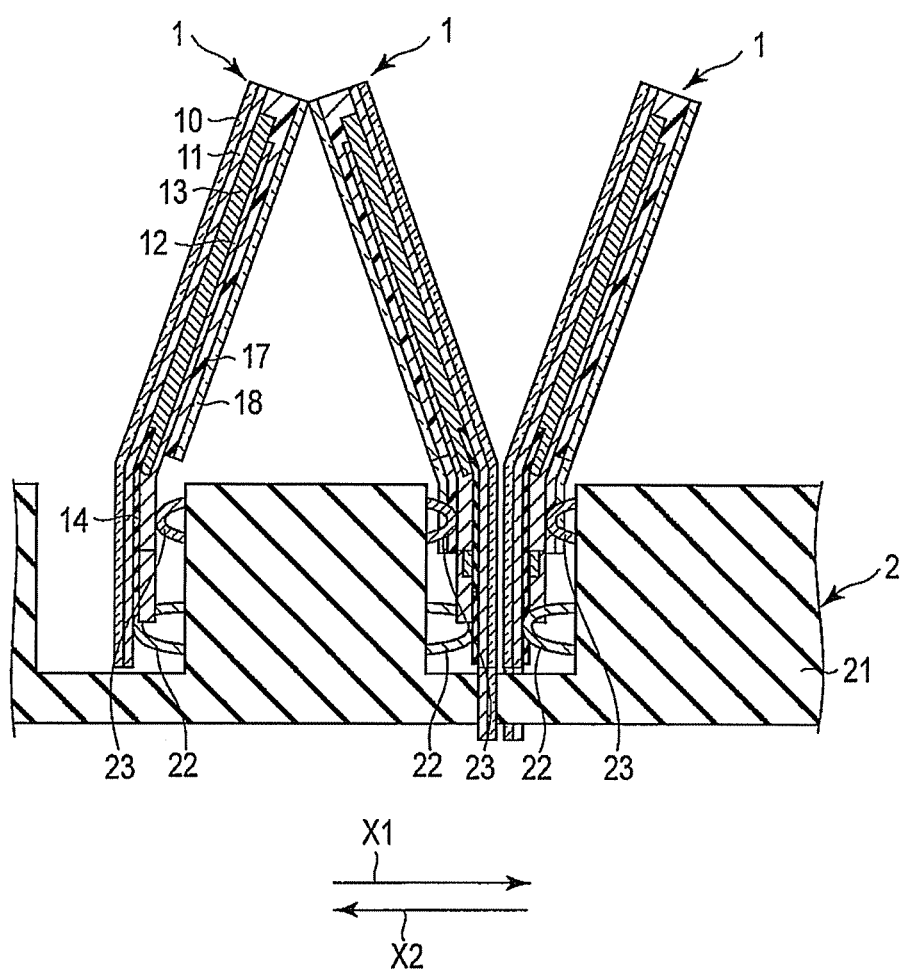
F I G. 23

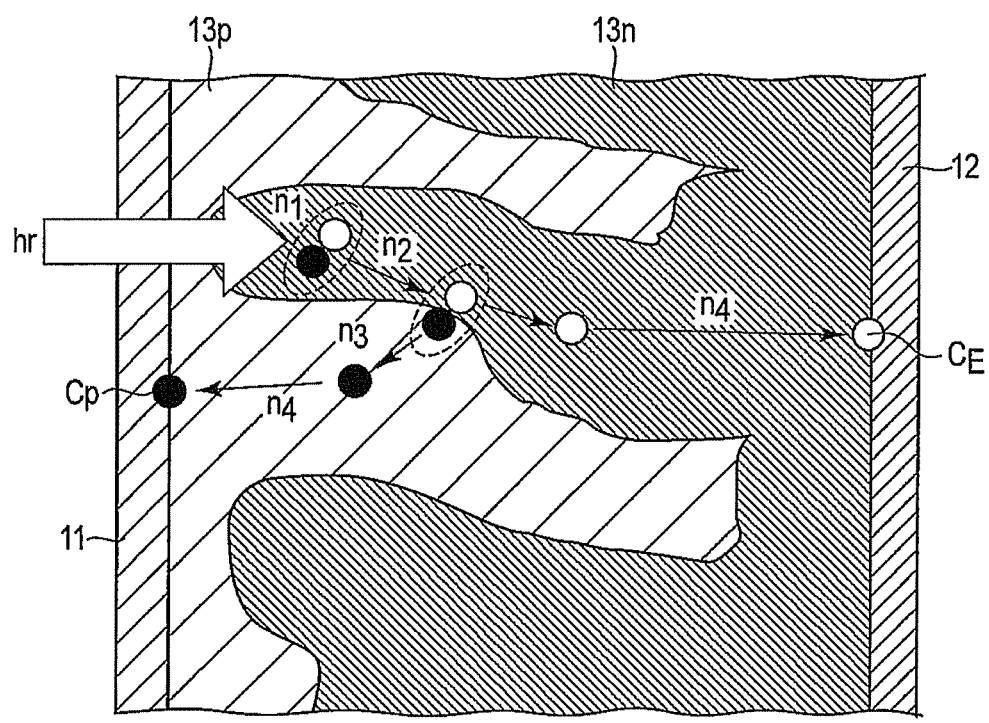
F I G. 26

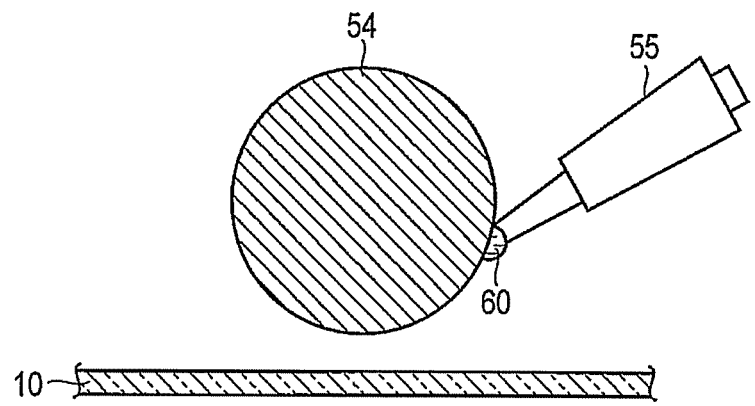
F I G. 32
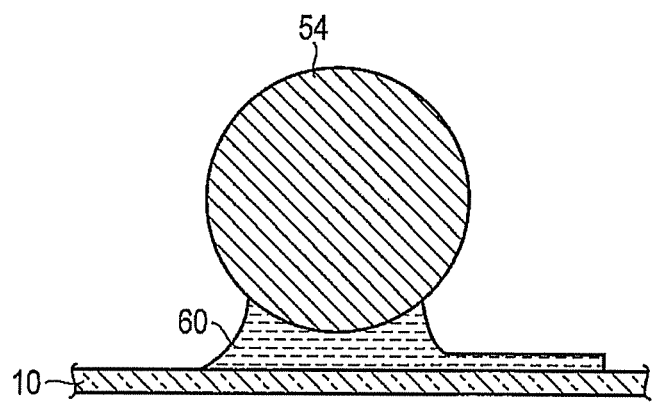
F I G. 33
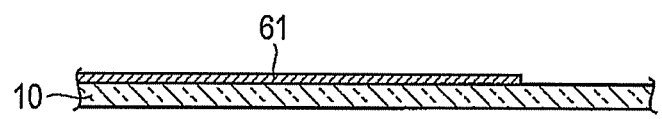
F I G. 34

SOLAR CELL MODULE

CROSS-REFERENCE TO RELATED APPLICATIONS

This application is based upon and claims the benefit of priority from prior Japanese Patent Application No. 2011-059905, filed Mar. 17, 2011, the entire contents of which are incorporated herein by reference.

FIELD

Embodiments described herein relate generally to a solar cell module.

BACKGROUND

An organic thin-film solar cell is a solar cell using an organic thin-film semiconductor such as a mixture of a conductive polymer and fullerene. Compared to solar cells using inorganic materials such as silicon, copper indium gallium diselenide (CIGS), and CdTe, the organic thin-film solar cell has the advantage that it can be produced by a simple method at a low cost. On the other hand, the organic thin-film solar cell has the problem that it is inferior in power conversion efficiency and life to the conventional inorganic solar cells. This is because factors that are difficult to control, e.g., the purity, molecular weight distribution, and orientation of a semiconductor material have influence on the characteristics of an organic semiconductor used in the organic thin-film solar cell.

Under the circumstances, various improvements have been made to increase the power conversion efficiency of the organic thin-film solar cell.

BRIEF DESCRIPTION OF THE DRAWINGS

FIG. 5 is a perspective view showing a state in which the solar cell device shown in FIG. 4 is bent;

FIGS. 6 to 10 are sectional views showing a first manufacturing method of the solar cell module shown in FIG. 3;

FIGS. 11 to 16 are plan views showing a second manufacturing method of the solar cell module shown in FIG. 3;

FIG. 20 is a sectional view of a solar cell module according to the second embodiment;

FIG. 21 is a development view of a solar cell device of the solar cell module shown in FIG. 20;

FIG. 23 is a sectional view of a solar cell module according to another modification;

FIG. 26 is a sectional view schematically showing a bulk-heterojunction type organic thin-film solar cell;

FIGS. 32, 33, and 34 are sectional views respectively showing the first, second, and third steps of the meniscus coating method using the apparatus shown in FIG. 31.

DETAILED DESCRIPTION

Figure 1:
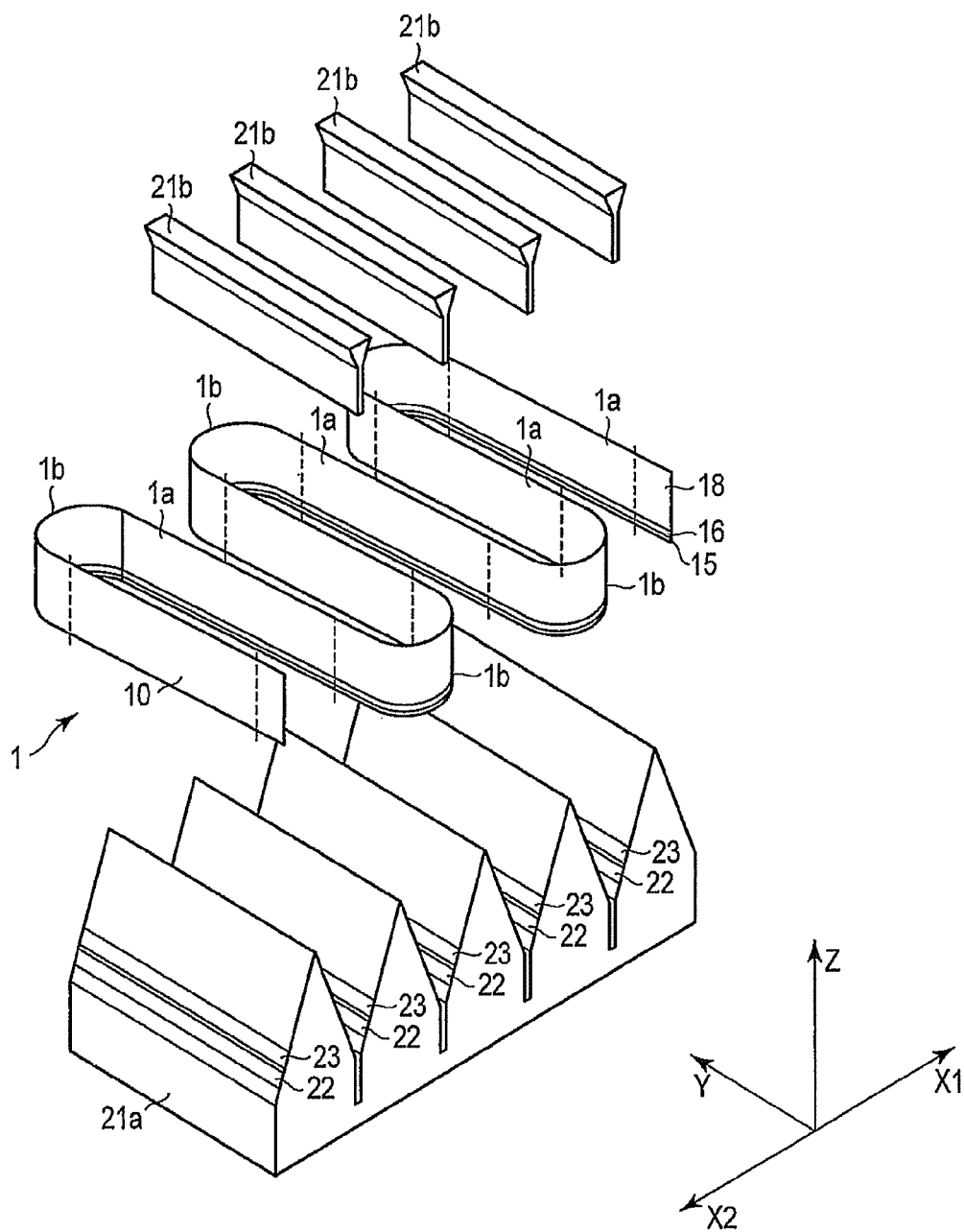
FIG. 1 is an exploded perspective view of a solar cell module according to the first embodiment.

In general, according to one embodiment, a solar cell module includes a solar cell device and a support structure supporting the solar cell device. The solar cell device is a belt-like solar cell device including first portions arranged in one direction such that major surfaces thereof face each other, and a second portion interposed between the first portions. The edges of the first portions that correspond to a pair of long sides of the solar cell device are parallel to each other. Two adjacent first portions incline forwardly and backwardly with respect to the one direction. The second portion includes one or more planar or curved surfaces to connect the two adjacent first portions to each other.

Various embodiments will be described below with reference to the drawings. In the drawings, the same reference characters denote components having the same or similar functions and duplicates descriptions will be omitted.

Figure 2:
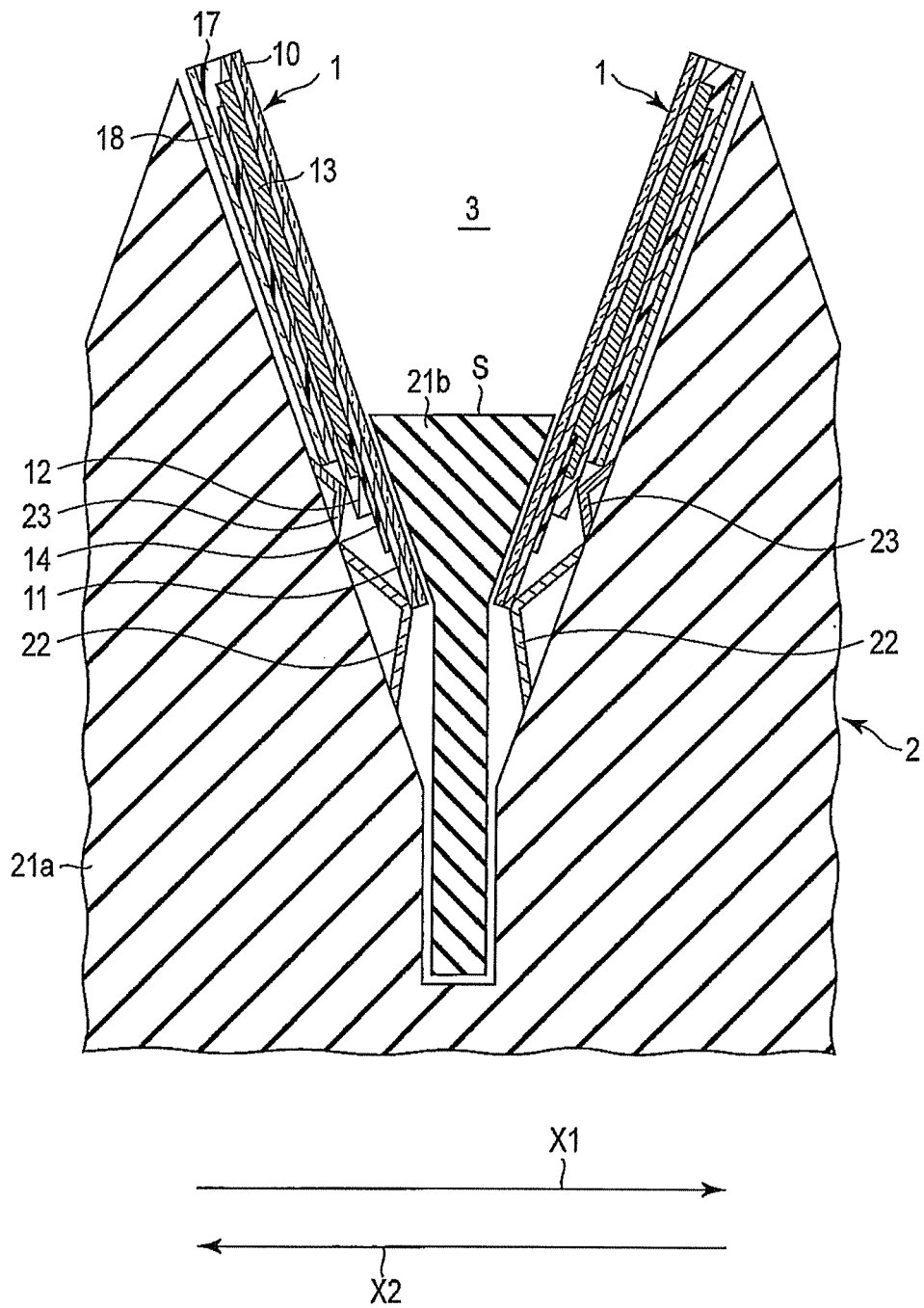
FIG. 2 is a sectional view of the solar cell module shown in FIG. 1.

As shown in FIG. 2, a solar cell module according to the first embodiment includes a solar cell device 1 and a support structure 2.

As shown in FIG. 1, the solar cell device 1 has a belt-like shape. The solar cell device 1 has one major surface as a front surface, and the other major surface as a back surface.

The solar cell device 1 includes a plurality of first portions arranged in one direction so that their major surfaces oppose each other, and second portions interposed between the first portions. That is, the solar cell device 1 includes first portions 1a and second portions 1b alternately arranged in the longitudinal direction. Although the solar cell device 1 includes a plurality of second portions 1b in this embodiment, the solar cell device 1 can include only one second portion 1b.

Each first portion has a pair of edges corresponding to a pair of long sides of the belt-like solar cell device 1. The edges of a given first portion and those of another first portion are parallel to each other. Also, two adjacent first portions incline toward a positive direction and negative direction with respect to the above-mentioned direction. Each second portion has one or more planar or curved surfaces, and connects the first portions.

The solar cell device 1 is flexible and bent into an S shape. More specifically, the solar cell device 1 is bent into a U shape or hairpin shape at the position of each second portion 1b.

In the solar cell device 1 bent as described above, those edges of the first portions 1a that correspond to a pair of long sides of the front surface of the solar cell device 1 are parallel to each other, and the first portions 1a are adjacent to each other in a first direction X1 perpendicular to these edges. Note that in FIG. 1, a second direction X2 is a direction opposite to the first direction X1, a third direction Y is a direction parallel to the aforementioned edges of the first portions 1$a$, and a fourth direction Z is a direction perpendicular to the directions X1 and Y.

The solar cell device 1 supported by the support structure 2 shown in FIG. 2 is the one that is obtained by further deforming the solar cell device 1 shown in FIG. 1. More specifically, in the solar cell device 1 shown in FIG. 2, the second portions 1$b$ are further bent to form a structure in which a first slope inclined toward the first direction X1 and a second slope inclined toward the second direction X2 are arranged in this order in the direction X1 or X2, in each region of the front surface of the solar cell device 1 that corresponds to two adjacent first portions 1$a$. That is, the second portions 1$b$ are further bent such that the region of the front surface of the solar cell device 1 that corresponds to two adjacent first portions 1$a$ forms a structure having an almost V shape or almost inverted V shape when viewed in the Y direction.

Although the second portion 1$b$ is bent in this embodiment, the second portion 1$b$ may also be folded or folded and bent. Note that the term "bend" means curving a portion so as not to form any crease, and the term "fold" means sharply bending a portion so as to form a crease.

The structure of the solar cell device 1 will be explained in more detail below.

Figure 3:
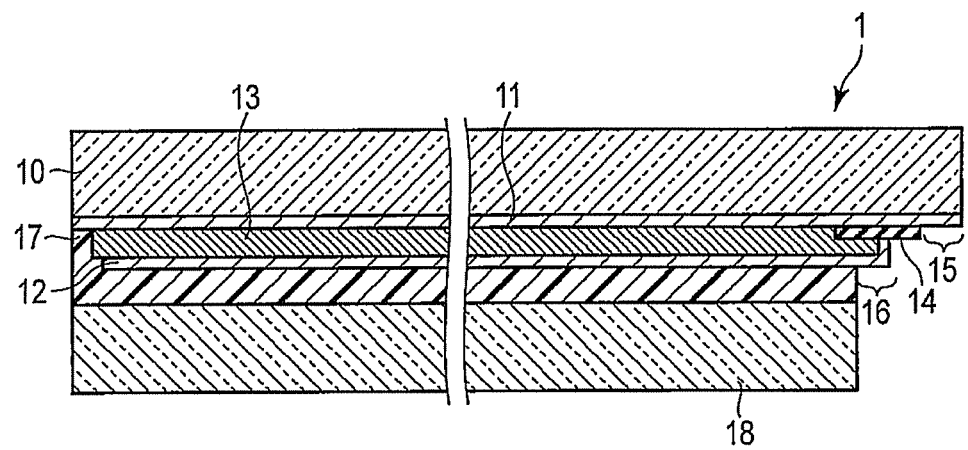
FIG. 3 is a sectional view of a solar cell device included in the solar cell module shown in FIGS. 1 and 2.

As shown in FIGS. 2 and 3, the solar cell device 1 includes a light-transmitting substrate 10, front electrode 11, back electrode 12, active layer 13, insulating layer 14, sealing layer 17, and encapsulating substrate 18. The front surface, i.e., the light-receptive surface of the solar cell device 1 is the surface of the light-transmitting substrate 10, and the back surface of the solar cell device 1 is the surface of the encapsulating substrate.

The light-transmitting substrate 10 has a belt-like shape. The term "light-transmitting" means properties that transmit, at a transmittance of 70% or more, light having a wavelength at which the active layer 13 can generate excitons when absorbing the light, or means that a material has the properties. Also, the term "light-reflecting" to be used later means properties that reflect, at a reflectance of 10% or more, light having a wavelength at which the active layer 13 can generate excitons when absorbing the light, or means that a material has the properties. The light-transmitting substrate 10 has first and second major surfaces. The first major surface includes first and second regions (not shown) extending in the longitudinal direction of the light-transmitting substrate 10 and arranged in the width direction of the light-transmitting substrate 10.

The front electrode 11 is light-transmitting. The front electrode 11 extends on the first and second regions. In the following description, a portion of the front electrode 11 positioned on the first region will be called an electrode body, and a portion of the front electrode 11 positioned on the second region will be called a terminal portion. This terminal portion is electrically connected to the electrode body. The front electrode 11 is an anode, and the terminal portion is used as an anode pad 15 shown in FIGS. 2 and 3. The anode pad 15 may also be separated from the front electrode 11. For example, patterns made of a conductive material such as molybdenum can be deposited as the anode pad 15 on the front electrode 11.

The insulating layer 14 covers a portion of the front electrode 11. The insulating layer 14 extends in the longitudinal direction of the light-transmitting substrate 10 so as to lie on the boundary between the electrode body and terminal portion. The insulating layer 14 is deposited to prevent an electrical short circuit between the front electrode 11 and back electrode 12. The insulating layer 14 can be omitted.

The active layer 13 is deposited on the electrode body. The portion of the insulating layer 14 positioned on the electrode body is covered with the active layer 13.

The back electrode 12 is deposited on the active layer 13. The back electrode 12 covers one major surface of the active layer 13 and the end face of the portion of the active layer 13 positioned on the insulating layer 14. The back electrode 12 is typically light-reflecting.

The solar cell device 1 can further include a hole transport/injection layer between the anode, i.e., the front electrode 11 and the active layer 13. Also, the solar cell device 1 can further include an electron transport/injection layer between the cathode, i.e., the back electrode 12 and the active layer 13. As the material of the hole transport/injection layer, it is possible to use, e.g., poly(3,4-ethylenedioxythiophene)-poly(styrene sulfonate) (PEDOT/PSS). As the material of the electron transport/injection layer, $TiO_x$ or the like can be used.

The encapsulating substrate 18 is adhered to the back electrode 12 with the sealing layer 17 being sandwiched between them. The sealing layer 17 covers the region of the surface of the active layer 13 that is not covered with the back electrode 12. The sealing layer 17 does not cover the region of the surface of the back electrode 12 that corresponds to the insulating layer 14. In this embodiment, the portion of the back electrode 12 that corresponds to the insulating layer 14 is used as a cathode pad 16 shown in FIGS. 2 and 3. The cathode pad 16 may also be separated from the back electrode 12. For example, it is also possible to form a pattern made of a conductive material such as molybdenum as the cathode pad 16 on the insulating layer 14 and form the back electrode 12 on the cathode pad 16.

The sealing layer 17 and encapsulating substrate 18 protect the device from oxygen and water. As the material of the sealing layer 17, it is possible to use, e.g., a thermosetting or ultraviolet curing epoxy polymer. As the encapsulating substrate 18, it is possible to use, e.g., a metal plate, or a film obtained by forming an inorganic or metal layer on the surface of a polymer film. As the polymer film, it is possible to use, e.g., a film made of polyethyleneterephthalate (PET), polyethylenenaphthalate (PEN), polyimide (PI), an ethylene-vinyl alcohol copolymer (EVOH), epichlorohydrin rubber (CO), an ethylene-vinyl acetate copolymer (EVA), polycarbonate (PC), or polyethersulfone (PES), or a multilayered film containing two or more of these materials. As the inorganic material or metal, it is possible to use, e.g., silica, titania, zirconia, silicon nitride, boron nitride, or Al. At least one of the sealing layer 17 and encapsulating substrate 18 can further contain a desiccant or oxygen absorbent.

The sealing layer 17 and encapsulating substrate 18 can be omitted.

The solar cell device 1 can further include antireflection layer(s) on the surface of the light-transmitting substrate 10, between the light-transmitting substrate 10 and the front electrode 11, or on the surface of the light-transmitting substrate 10 and between the light-transmitting substrate 10 and the front electrode 11. As the antireflection layer, it is possible to use, e.g., an antireflection coating or a film or sheet like antireflection layer. Examples of the material of the antireflection layer are inorganic materials such as titanium oxide, and organic materials such as an acrylic polymer and polycarbonate polymer. The antireflection layer desirably has a fine moth-eye protruding structure. Since a film having this protruding structure continuously changes the refractive index in the thickness direction, most of light incident on the film is not reflected and can be transmitted. A film having the moth-eye protruding structure is obtained by making a mold having a fine three-dimensional structure, and transferring the relief structure of this mold onto a polymer sheet or an inorganic or organic spin on glass (SOG) film. It is also possible to form a paint or the like capable of preventing reflection by the same principle as that of the moth-eye structure by using, e.g., self-organization of titanium oxide, and apply the paint.

The solar cell device 1 can further include a layer that converts short wavelength components of the solar light into long wavelength components. A layer like this can further increase the power conversion efficiency. For example, the power conversion efficiency can be increased by coating the surface of the light-transmitting substrate 1 with a europium complex.

Alternatively, the solar cell device 1 can further include an upconversion-type fluorescence or phosphorescence layer that converts long wavelength components of the solar light into short wavelength components. This layer can further increase the power conversion efficiency.

As shown in FIGS. 1 and 2, the support structure 2 includes a first member 21a, second members 21b, first contact electrodes 22, and second contact electrodes 23.

The first member 21a is positioned below the solar cell device 1. The first member 21a at least partially opposes the region of the back surface of the solar cell device 1 that corresponds to the first portions 1a. The first and second members 21a and 21b support the solar cell device 1 at the position of one long side. The first member 21a includes a plurality of V-shaped grooves arranged in the width direction. The V-shaped grooves have a longitudinal direction parallel to the third direction Y, and are arranged in the direction X1 or X2. The solar cell device 1 is set such that its back surface is in contact with the inclined wall surfaces of the V-shaped grooves at the positions of the first portions 1a. The first member 21a is made of an insulating material such as a polymer.

In the bottom of each V-shaped groove, a rectangular groove narrower than the V-shaped groove is formed such that the longitudinal directions of these grooves match. This rectangular groove has the same function as that of a mortise.

The second member 21b pushes the first portion 1a of the solar cell device 1 against the first member 21a at the bottom of each trough formed by the array of the above-described first and second slopes. Each second member 21b includes a wedge-shaped portion and a protruding portion positioned at the distal end of the wedge-shaped portion. The protruding portion fits in the aforesaid rectangular groove, and fixes the second member 21b to the first member 1a. As shown in FIG. 2, the wedge-shaped portion pushes the first portion 1a against the first member 21a.

Typically, a portion S of the second member 21b that faces a region 3 sandwiched between the first and second slopes obliquely opposing each other has a light-reflecting property, e.g., specular reflection properties or light-scattering properties. When adopting this design, light having entered the light-reflecting portion S is reflected by it and can enter the solar cell device 1. This makes it possible to achieve a power conversion efficiency higher than that when the portion S is not light-reflecting.

Note that the support structure 2 includes the plurality of second members 21b in this embodiment, but the second members 21b may also be integrated, or only one second member 21b may also be used.

Each first contact electrode 22 extends in the third direction Y on the slope of the first member 21a. While the support structure 2 is supporting the solar cell device 1, the first contact electrode 22 is in contact with the anode pad 15 at the position of the first portion 1a.

Each second contact electrode 23 extends in the third direction Y on the slope of the first member 21a. While the support structure 2 is supporting the solar cell device 1, the second contact electrode 23 is in contact with the cathode pad 16 at the position of the first portion 1a.

The contact electrodes 22 and 23 can have a spring structure. The spring structure is advantageous in improving the reliability of fixation, electrical connection, and the like.

Each of the first and second contact electrodes 22 and 23 can continue in the third direction Y. It is also possible to form each of the first and second contact electrodes 22 and 23 by a plurality of conductive portions arranged in the third direction Y, and electrically connect these conductive portions to each other inside the first member 21a. When using the latter structure, it is possible to more reliably make electric connections while reducing the force required to insert the solar cell device 1 and second members 21b. Furthermore, when the pitch of the conductive portions is, e.g., 200 mm or less, characteristic deterioration caused by the electrical resistances of the anode pad 15 and cathode pad 16 can be prevented.

The contact electrodes 22 and 23 can be formed to connect the first portions 1a in series or parallel. The electrical connection between the contact electrodes 22 and 23 is arbitrary.

In this solar cell module, the solar cell device 1 is installed such that the light-receptive surface of the first portion 1a inclines at an angle θ to a plane perpendicular to the Z direction. Therefore, when the solar cell module is irradiated with light in the Z direction, for example, the light obliquely enters the active layer 13. That is, the apparent thickness of the active layer 13 when using this arrangement is larger than that when using an arrangement in which light perpendicularly enters the active layer 13. Accordingly, a larger number of excitons can be generated in the active layer 13 without increasing the actual thickness of the active layer 13. That is, the magnitude of an electric current can be increased without increasing the electrical resistance of the active layer 13, in other words, without deactivating the generated carriers. As a consequence, the power conversion efficiency increases.

Also, in this solar cell module, the solar cell device 1 is installed such that the light-receptive surfaces of adjacent first portions 1a obliquely oppose each other. In this arrangement, light reflected by one first portion 1a can enter the other first portion 1a. This increases the amount of light usable in power conversion, and increases the power conversion efficiency. The structure in which the light-receptive surfaces obliquely oppose each other will be called "a multi-slope structure" hereinafter.

The inclination θ of the light-receptive surface to the plane perpendicular to the fourth direction Z is, e.g., 45° to 89°, and preferably 65° to 75°. When the angle θ is 45° or more, the increase in power conversion efficiency due to the increase in apparent thickness of the active layer 13 and the use of the reflected light in power conversion is remarkable. On the other hand, if the angle θ is made larger than 89°, the area of the first portion 1a required to obtain the multi-slope structure becomes too large, and this may increase the cost.

The light transmittance of the active layer 13 is, e.g., 3% or more, and preferably 10% or more. If the transmittance is less than 3%, the increase in power conversion efficiency is slight even when the angle θ is increased. When the transmittance is 3% or more, the power conversion efficiency increases as the angle θ increases. This is so because a active layer having a high absorptance can sufficiently absorb photons regardless of the propagation direction of incident light, but the absorptance of a active layer obtained from the existing organic semiconductors is at most about a few 10% when the film thickness is about 100 nm.

Furthermore, this solar cell module is excellent in the following respects.

Figure 4:
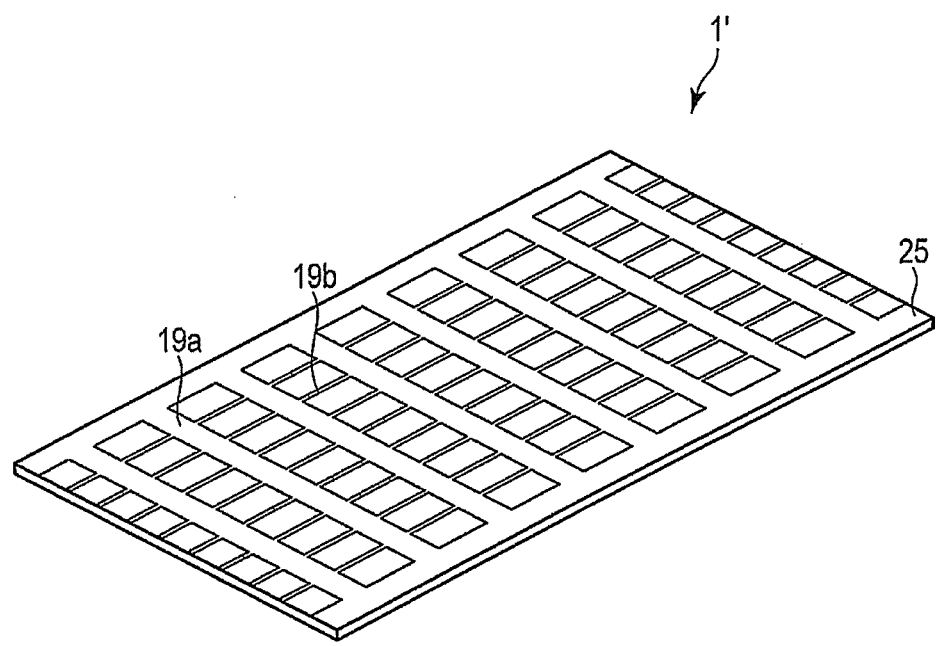
FIG. 4 is a perspective view showing a solar cell device of a solar cell module according to a comparative example.

FIGS. 4 and 5 illustrate another method of forming the multi-slope structure. In this method as shown in FIG. 4, a planar flexible solar cell device 1' is first prepared. Then, a multi-slope structure shown in FIG. 5 is obtained by folding or bending the solar cell device 1'.

In the solar cell device 1' used in this method, the sheet resistance of the front electrode 11 exerts a large influence on the power conversion efficiency. Therefore, bus lines 19a and grid lines 19b must be formed in the solar cell device 1' and connected to the electrode pad 15. Generally, however, a metal having a high electrical conductivity is used as the bus lines 19a and grid lines 19b. Accordingly, no high aperture ratio can be achieved when forming the multi-slope structure by the method shown in FIGS. 4 and 5.

By contrast, in the solar cell module described with reference to FIGS. 1 to 3, the anode pad 15 and first contact electrodes 22 have the function of the bus lines 19a, and are arranged between the members 21a and 21b. Since no light normally reaches a portion of the solar cell device 1 positioned between the members 21a and 21b, the aperture ratio does not decrease even when the anode pad 15 and the like are arranged in this portion.

Also, when the width (the dimension in the short side direction) of the solar cell device 1 is decreased, the distance to the anode pad 15 shortens regardless of a position on the electrode body. This reduces the influence of the sheet resistance of the front electrode 12 on the electrical potential drop. Accordingly, members equivalent to the grid lines can be omitted or simplified. The presence/absence of the grid lines exerts influence on the sheet resistance and aperture ratio, and the power conversion efficiency of the device fluctuates in accordance with the sheet resistance and aperture ratio. In an organic thin-film solar cell device, a higher power conversion efficiency can be obtained by omitting the grid lines when the width of the solar cell device 1 is, e.g., less than 30 mm, and preferably less than 20 mm. When the grid lines are omitted, the grid line formation process can be omitted. Also, since the active layer 13 can be deposited on a flat surface, the active layer 13 having a high film thickness accuracy can be obtained by various film deposition methods. When the width of the solar cell device 1 is 30 mm (inclusive) to 60 mm (exclusive), grid lines are preferably formed. Even in this case, however, when compared to the structure described with reference to FIGS. 4 and 5, it is possible to decrease the width and height of the grid lines, and increase the pitch of the grid lines. This is advantageous for the aperture ratio and film deposition process. Note that when the width of the solar cell device 1 is 80 mm or more, a structure equivalent to the bus line is further necessary in normal cases in addition to the anode pad 15.

The decrease in power conversion efficiency caused by the sheet resistance of the electrode occurs not only in the front electrode 11 but also in the back electrode 12. Generally, the back electrode 12 need not be light-transmitting, so a metal is often used as the material. Accordingly, the influence of the sheet resistance of the back electrode 12 on the electrical potential drop is small, but cannot be neglected when the area of the solar cell device increases. When adopting the structure described with reference to FIGS. 4 and 5, therefore, a thick aluminum layer having a large area must be deposited as the back electrode 12 by evaporation. This requires high installation and manufacturing costs.

By contrast, in the solar cell module described with reference to FIGS. 1 to 3, the influence of the sheet resistance of the back electrode 12 can be neglected when the width of the solar cell device 1 is sufficiently small. Accordingly, the back electrode 12 can be deposited thin when using evaporation. Alternatively, the back electrode 12 can be deposited by a low cost process such as metal paste coating or conductive polymer coating.

Furthermore, when the solar cell device 1' described with reference to FIGS. 4 and 5 is bent at a small radius of curvature, an electrical short circuit may occur between the front electrode 11 and the back electrode 12, a defect may occur in each layer forming the solar cell device 1' and deteriorate the sealing function, or undesired electrical insulation may occur. Therefore, the front electrode 11 and/or back electrode 12 must be patterned so that at least one of the front electrode 11 and back electrode 12 does not exist in a region at a distance of, e.g., about 0.2 to 0.5 mm from the crease. When the solar cell device 1' described with reference to FIGS. 4 and 5 is bent at a large radius of curvature in order to prevent the above-mentioned electrical short circuit, the ratio of a region where the inclination falls outside an appropriate range increases in the light-receptive surface. In this case, therefore, the increase in power conversion efficiency due to the increase in apparent thickness of the active layer 13 and the use of the reflected light in power conversion is small. The radius of curvature has a lower limit. Accordingly, the ratio of the region where the inclination falls outside an appropriate range increases in the light-receptive surface as the inclination θ of the light-receptive surface of the solar cell device 1' increases, i.e., the spacings between peaks and troughs narrow. That is, even when the inclination θ is increased in order to increase the power conversion efficiency, no high power conversion efficiency can be obtained because the ratio of the region where the inclination falls outside an appropriate range is high.

By contrast, in the solar cell module described with reference to FIGS. 1 to 3, the solar cell device 1 is bent at the positions of the second portions 1b. Even when the solar cell device 1 is bent at a large radius of curvature, therefore, the inclination can be set in an appropriate range over the entire light-receptive surface, i.e., the entire surface of the first portion 1a.

Also, in the solar cell module described with reference to FIGS. 1 to 3, a simple structure can be adopted as the solar cell device 1. Accordingly, the solar cell module can be manufactured at a low cost. This will be described with reference to FIGS. 6 to 10.

Figure 8:
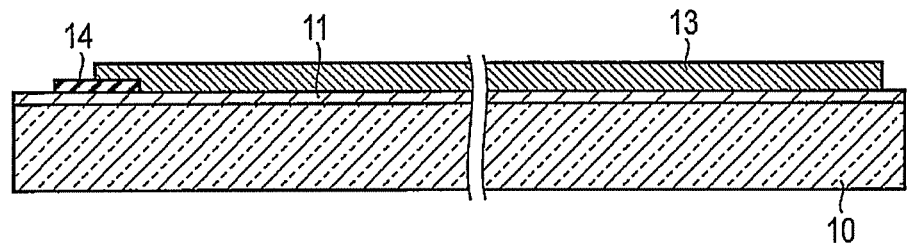
Figure 9:
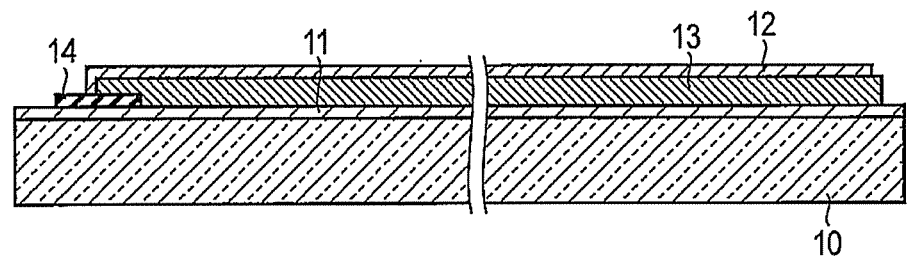
Figure 10:
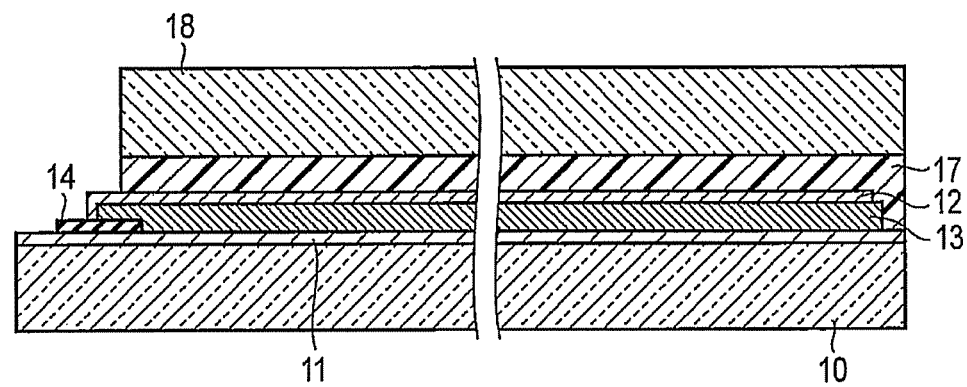
Figure 13:
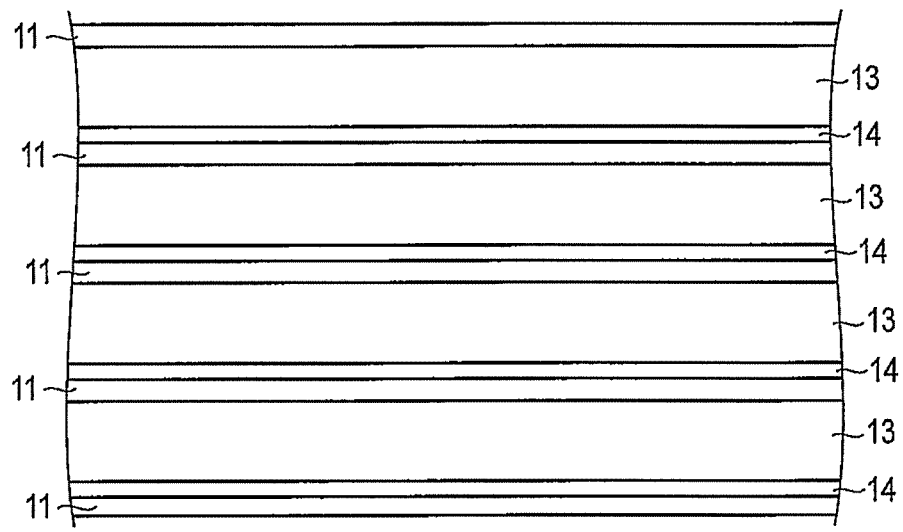
Figure 14:
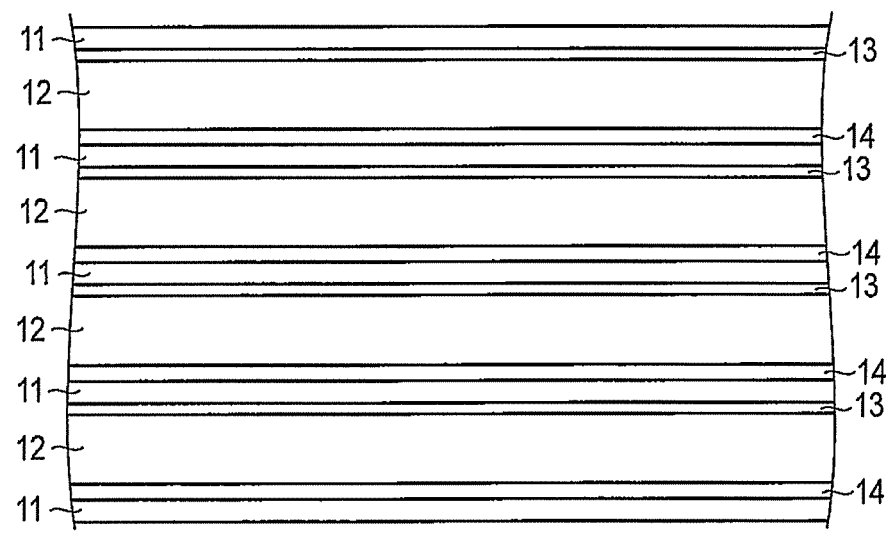
Figure 15:
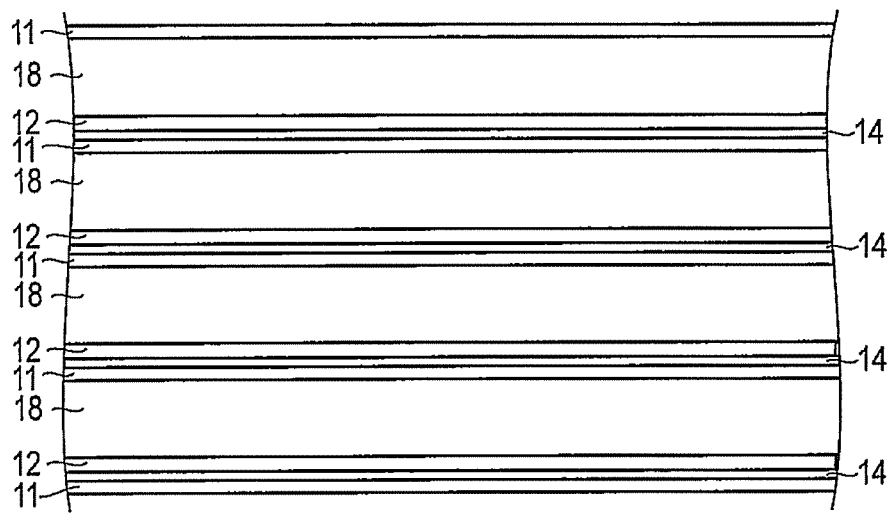

In a method shown in FIGS. 6 to 10, a belt-like light-transmitting substrate 10 is first prepared, and a front electrode 11 made of, e.g., indium tin oxide (ITO) is deposited to cover most of one major surface of the light-transmitting substrate 10 as shown in FIG. 6. Then, as shown in FIG. 7, on the front electrode 11, a belt-like insulating layer 14 extending in a direction parallel to one long side of the front electrode 11 is deposited at a position slightly spaced apart from the aforementioned long side. Subsequently, as shown in FIG. 8, a belt-like active layer 13 extending in the direction parallel to the above-mentioned long side of the front electrode 11 is deposited on it. The active layer 13 is deposited so as not to cover the region of the front electrode 11 that is adjacent to the aforesaid long side. After that, as shown in FIG. 9, a back electrode 12 is deposited on the active layer 13. The back electrode 12 is spaced apart from the front electrode 11. Finally, as shown in FIG. 10, a encapsulating substrate 18 is adhered to the back electrode 12 through a sealing layer 17. The solar cell device 1 is obtained as described above.

After that, the solar cell device 1 is supported by the support structure 2. For example, one end of the solar cell device 1 is fixed to the first member 21a at a predetermined position on the first member 21a, and another portion of the solar cell device 1 is moved back and forth in the longitudinal direction in the V-shaped groove. The same operation is performed for other V-shaped grooves. Alternatively, one end of the solar cell device 1 is fixed to the first member 21a at a predetermined position on the first member 21a, and an operation of rotating the support structure 180° clockwise and an operation of rotating the support structure 180° counterclockwise are performed for each V-shaped groove. Then, the second members 21b are connected to the first member 21a. Alternatively, a robot arm is used to place the solar cell device 1 bent into an S shape on the first member 21a, and connect the second members 21b to the first member 21a in this state. When the second members 21b are connected to the first member 21a, the solar cell device 1 deforms as explained previously. The solar cell module is thus completed.

In this method, each layer to be deposited on the light-transmitting substrate 10 is formed as a belt-like layer extending in the longitudinal direction of the light-transmitting substrate 10. That is, one-dimensionally patterned layers need only be deposited in this method.

On the other hand, to manufacture the solar cell device 1' described with reference to FIGS. 4 and 5, the bus lines 19a and grid lines 19b extending in different directions must be deposited. That is, two-dimensionally patterned layers must be deposited. In addition, it is sometimes necessary to form other layers as two-dimensionally patterned layers.

Table 1 below shows the classification of film deposition methods.

TABLE 1

| Film deposition method | | Applicability to two-dimensional pattern formation | Non-contact type | Applicability to large-area film deposition | Material utilization efficiency |
|---|---|---|---|---|---|
| larger grouping | Smaller grouping | | | | |
| Meniscus coating method | Capillary coating | Case by case | Yes | Yes | High |
| | Meniscus coating | Case by case | Yes | Yes | High |
| | Slit (dye) coating | Case by case | Yes | Yes | High |
| | Dip coating | No | Yes | No | Low |
| Transfer method | Screen printing | Yes | No | Yes | High |
| | Gravure printing | Yes | No | Yes | High |
| | Gravure offset printing | Yes | No | Yes | High |
| Vacuum process | Evaporation | Yes | Yes | No | Low |
| | Sputtering | Yes | Yes | No | Low |
| Other methods | Inkjet printing | Case by case | Yes | Yes | High |
| | Spray coating | Case by case | Yes | Yes | High |
| | Spin coating | No | Yes | No | Low |

As shown in Table 1, the film deposition methods are roughly classified into a contact type and non-contact type. In the manufacture of a solar cell device, the non-contact type is favorable when mechanical damage to the substrate is taken into account, and the ability to form a layer having a large area at a high material utilization ratio is also favorable. As shown in Table 1, some meniscus coating methods and a coating method using inkjet printing or a spray coater satisfy the above-mentioned three requirements, although it is difficult for these methods to form a two-dimensionally patterned layer with a high film thickness accuracy. These film deposition methods can be used in the method shown in FIGS. 6 to 10 because one-dimensionally patterned layers need only be deposited. This makes it possible to manufacture the solar cell device 1 having excellent characteristics at a low cost.

Also, the use of evaporation or the like has the following advantage. When depositing a two-dimensionally patterned layer by a roll-to-roll process, it is necessary to adopt an in-line process by which a substrate for film deposition and a mask are transferred at the same speed, or a process by which a substrate for film deposition is transferred by stop-and-go transfer while a mask is fixed. On the other hand, when depositing a one-dimensionally patterned layer by the roll-to-roll process, a substrate for film deposition can be transferred at a predetermined speed with a mask being fixed. This can further reduce the cost.

Furthermore, the manufacture of the solar cell device 1' described with reference to FIGS. 4 and 5 requires an apparatus capable of depositing a film having a width equivalent to at least the length of a short side of the solar cell device 1'. By contrast, in the manufacture of the solar cell module described with reference to FIGS. 1 to 3, a film having a width of, e.g., about 200 mm need only be deposited. Accordingly, a small sized film deposition apparatus can be used.

Note that in the manufacture of the solar cell module described with reference to FIGS. 1 to 3, the end portions of each layer on the film deposition start and termination sides can be spaced apart from the ends of the light-transmitting substrate 10 in order to prevent an electrical short circuit between the electrodes 11 and 12 or to reliably perform sealing. That is, each layer can also be deposited as a two-dimensionally patterned layer. In this case, film deposition is started after masking tapes are adhered to the end portions on the film deposition start and termination sides. Alternatively, film deposition is started from a position spaced apart from the front end of the light-transmitting substrate 10, and terminated at a position spaced apart from the rear end of the light-transmitting substrate 10.

The solar cell device 1 shown in FIG. 3 can also be manufactured by a method shown in FIGS. 11 to 16.

Figure 16:
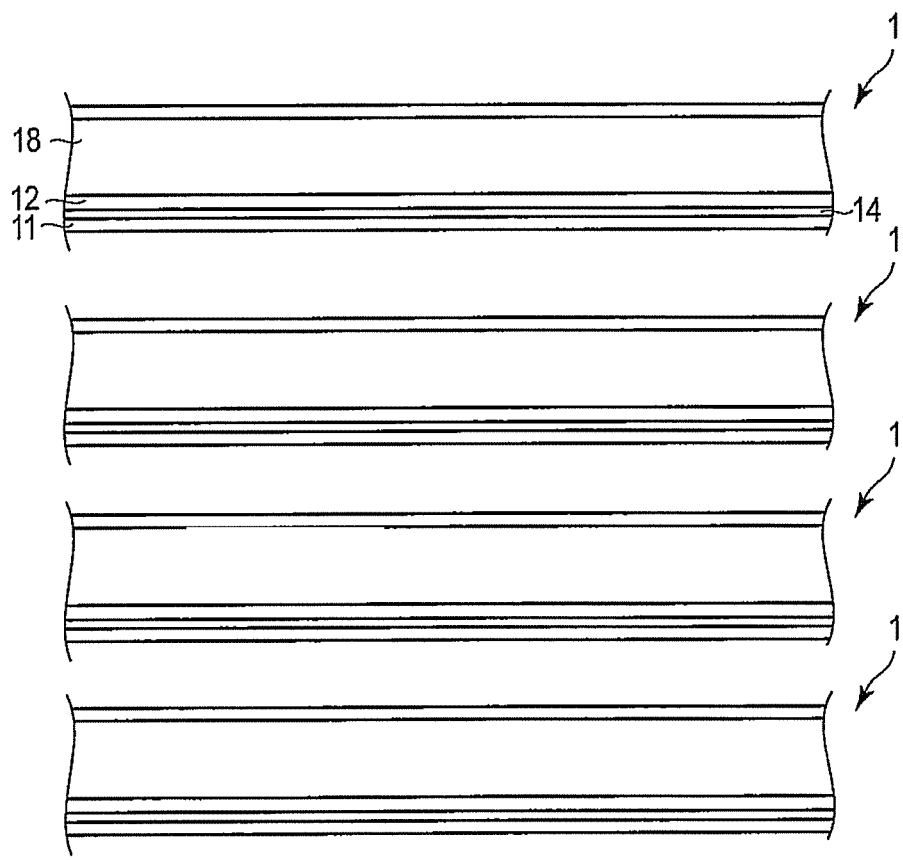

This method is the same as that described with reference to FIGS. 6 to 10, except that the light-transmitting substrate 10 having a large width as shown in FIG. 11 is used (one major surface of the substrate is entirely covered with the front electrode 12 in FIG. 11), and the light-transmitting substrate 10 and the like are cut in a final step as shown in FIG. 16. Note that in this method, a plurality of layers are simultaneously deposited or adhered as shown in FIGS. 12 to 15. The plurality of layers can simultaneously be deposited by using a multi-head film deposition apparatus such as a slit coater in which a plurality of slit dies are arranged in the width direction, or a multi-nozzle inkjet apparatus. This method can increase the throughput, although the width of the film deposition apparatus is large.

Figure 17:
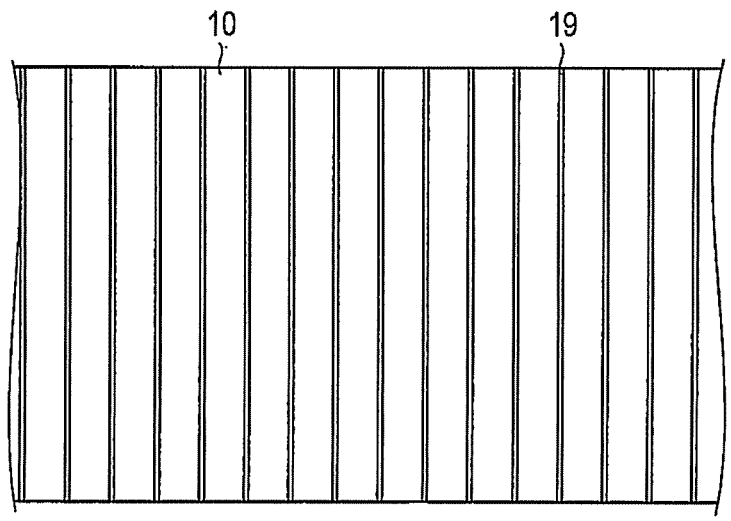
FIGS. 17 and 18 are plan views showing a manufacturing method of a solar cell module according to a modification.
Figure 18:
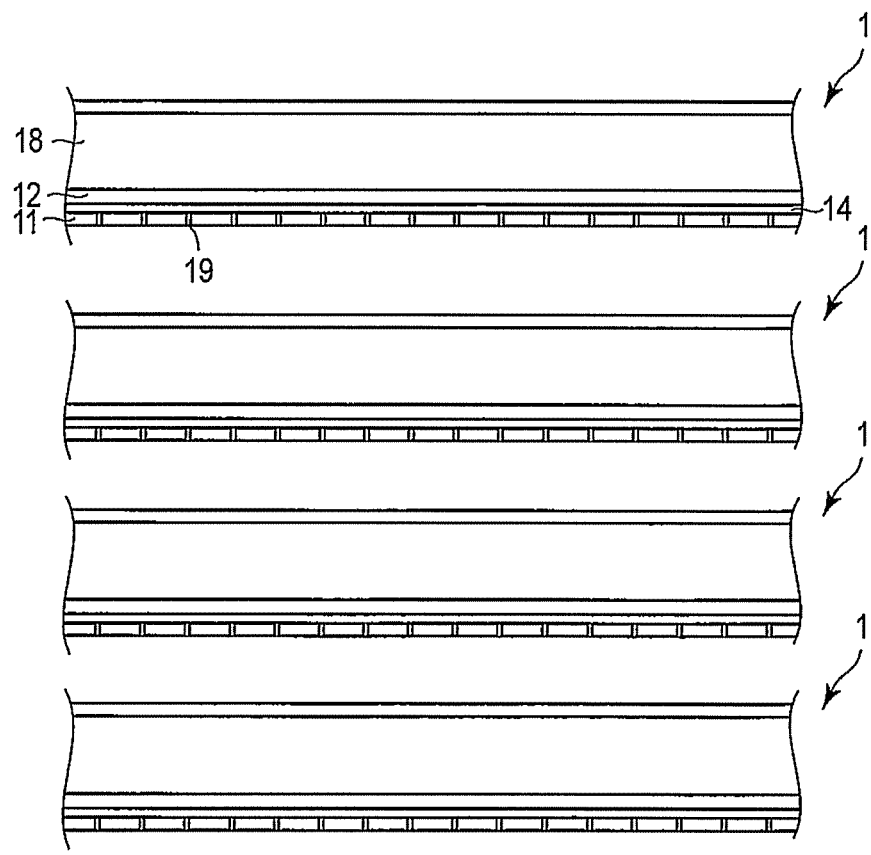

In the case of forming auxiliary lines, e.g., a method shown in FIGS. 17 and 18 can be used.

This method is the same as that described with reference to FIGS. 11 to 16, except that before the front electrode 11 is deposited, auxiliary lines 19 are formed on the light-transmitting substrate 10 as shown in FIG. 17, thereby obtaining a structure shown in FIG. 18 instead of the structure shown in FIG. 16. The auxiliary lines 19 achieve an effect equivalent to the grid lines, and are suitable when the width of the solar cell device 1 is 30 mm (inclusive) to 60 mm (exclusive).

In the solar cell module 1 described with reference to FIGS. 1 and 2, the portion S of the second member 21*b* that faces the region 3 is preferably as small as possible from the viewpoint of the power conversion efficiency. However, the portion S desirably has a size to some extent in order to fix the solar cell device 1. As described earlier, a high power conversion efficiency can be achieved when the portion S is given a light-reflecting property, e.g., specular reflection property or diffuse reflection property.

Figure 19:
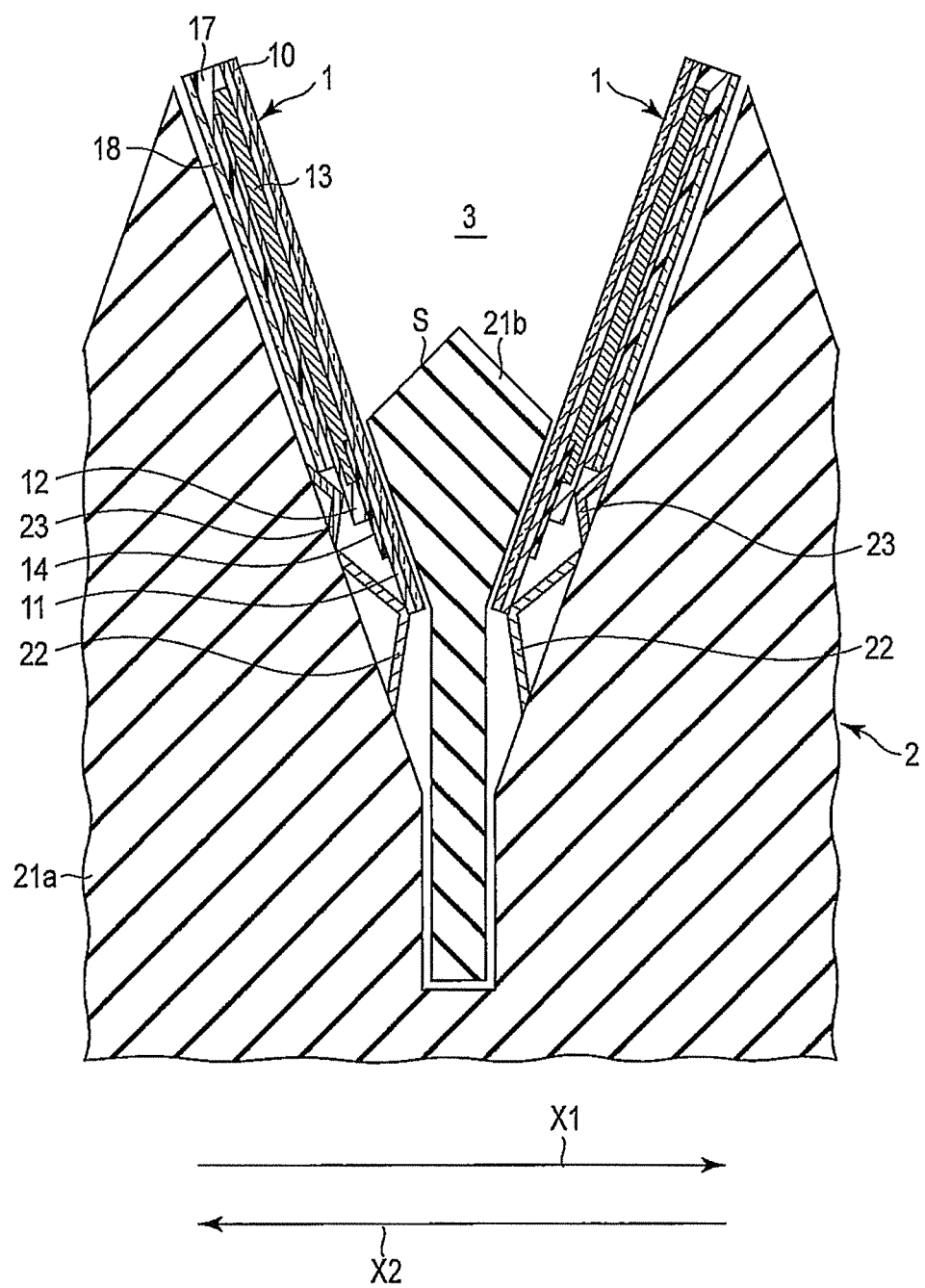
FIG. 19 is a sectional view of a solar cell module according to another modification.

When the portion S has a light-reflecting property, the light-reflecting portion S need not be parallel to the first direction X1 and third direction Y. For example, a section of the light-reflecting portion S that is perpendicular to the third direction Y can have a V shape. Alternatively, as shown in FIG. 19, the section of the light-reflecting portion S that is perpendicular to the third direction Y may have an inverted V shape. With this arrangement, light having entered the light-reflecting portion S can enter the first portion 1*a* more efficiently.

As the second member 21*b* including the specular reflection portion S, it is possible to use, e.g., a metal part made of aluminum or chromium and having a well polished surface, a glass or polymer part having a surface on which silver plating or aluminum evaporation is performed, or a glass or polymer part having a surface covered with any of various metal foils. For example, a reflectance of 98% or more is obtained by using Vikuiti ESR as a reflecting film manufactured by 3M. Also, as the second member 21*b* including the diffuse reflection portion S, it is possible to use, e.g., a metal part made of aluminum or chromium and having a roughened surface, a glass or polymer part coated with a white paint, or a part supporting any of various light-diffusion layers.

The second embodiment will be explained below with reference to FIGS. 20 to 25.

The solar cell module shown in FIG. 20 is the same as the solar cell module described with reference to FIGS. 1 to 3, except that the following arrangement is adopted.

That is, in this solar cell module, the support structure 2 includes a member 21 instead of the first member 21*a* and second members 21*b*. The member 21 has a plurality of grooves. The longitudinal directions of these grooves are parallel to each other, and perpendicular to a first direction X1. Of two adjacent grooves, the depth direction of one groove inclines toward the first direction X1, an that of the other groove inclines toward a second direction X2. These grooves have almost the same function as that of the gaps between the first member 21*a* and second members 21*b*.

The solar cell device 1 is bent at the positions of the second portions 1*b*. Note that in FIG. 21, a line L1 indicates a crease for making a valley fold, and a line L2 indicates a crease for making a mountain fold. The first portions 1*a* of the solar cell device 1 folded at the second portion 1*b* are inserted into the grooves of the member 21. Thus, the support structure 2 can support the solar cell device 1 by various methods.

Figure 22:
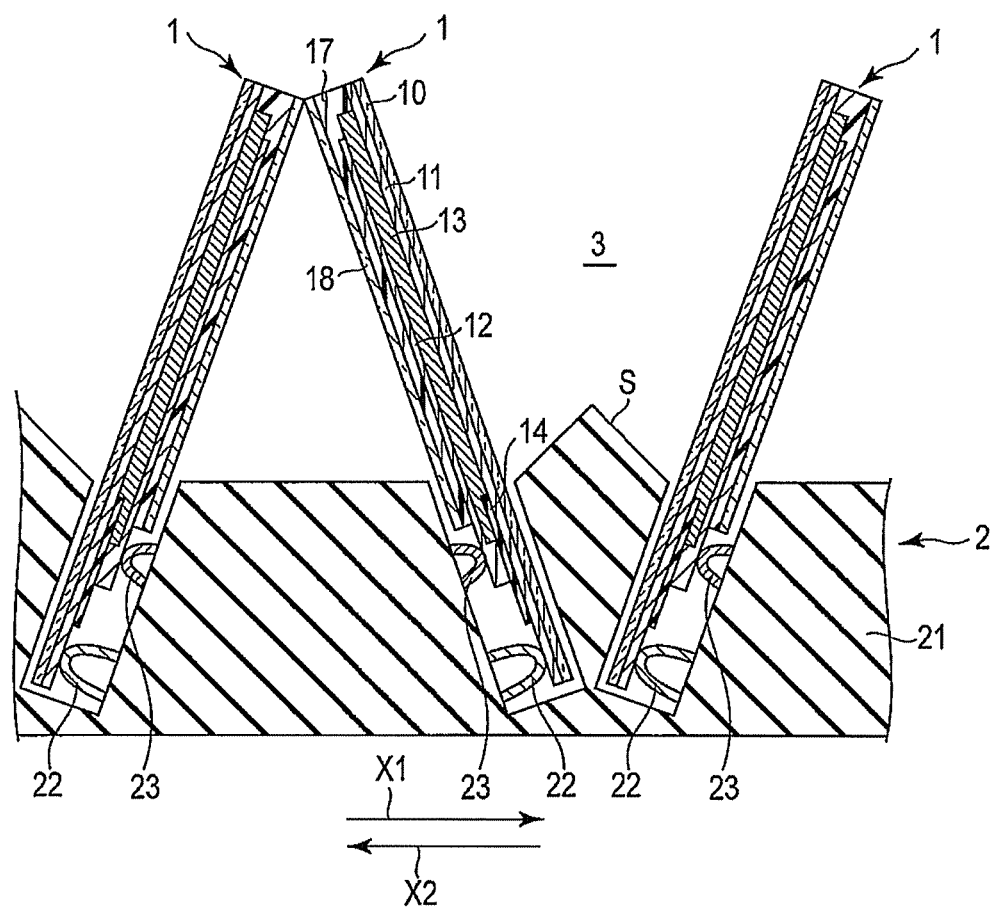
FIG. 22 is a sectional view of a solar cell module according to a modification.

In this solar cell module, the portion S of the member 21 that faces the region 3 preferably has a light-reflecting property, e.g., specular reflection property or diffuse reflection property. In this case, the light-reflecting portion S need not be parallel to the first direction X1 and the third direction Y. For example, the section of the light-transmitting portion S that is perpendicular to the third direction Y can have a V shape. Alternatively, as shown in FIG. 22, the section of the light-reflecting portion S that is perpendicular to the third direction Y may also have an inverted V shape. With this arrangement, light having entered the light-reflecting portion S can enter the first portion 1*a* more efficiently.

In this solar cell module, a triangular hollow is formed in a region surrounded by the support structure 2 and the first portions 1*a* obliquely opposing each other back to back, unlike in the solar cell module described with reference to FIGS. 1 to 3. The solar cell module can also be cooled by using this hollow. For example, the support structure 2 may have a channel for circulating a refrigerant in a region sandwiched between the first portions 1*a* opposing each other back to back. In a temperature range higher than room temperature, the power conversion efficiency of a solar cell increases as the temperature decreases. Therefore, a higher power conversion efficiency can be achieved by using the above-mentioned arrangement. Although some organic thin-film solar cells increase the power conversion efficiency as the temperature rises, it is desirable to make a solar cell easy to cool in order to prolong the life.

As shown in FIG. 23, two first portions 1*a* can be inserted into a single groove.

In the solar cell module shown in FIG. 23, the depth direction of the grooves formed in the member 21 is perpendicular to the first direction X1. A set of contact electrodes 22 and 23 are formed on each of the two sidewalls of the groove.

Figure 24:
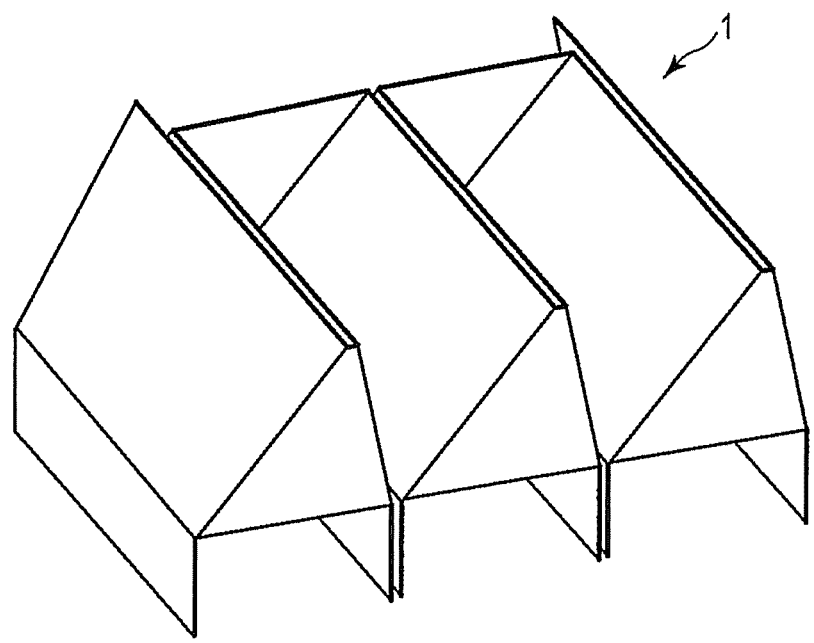
FIG. 24 is a schematic perspective view of a solar cell device of the solar cell module shown in FIG. 23.
Figure 25:
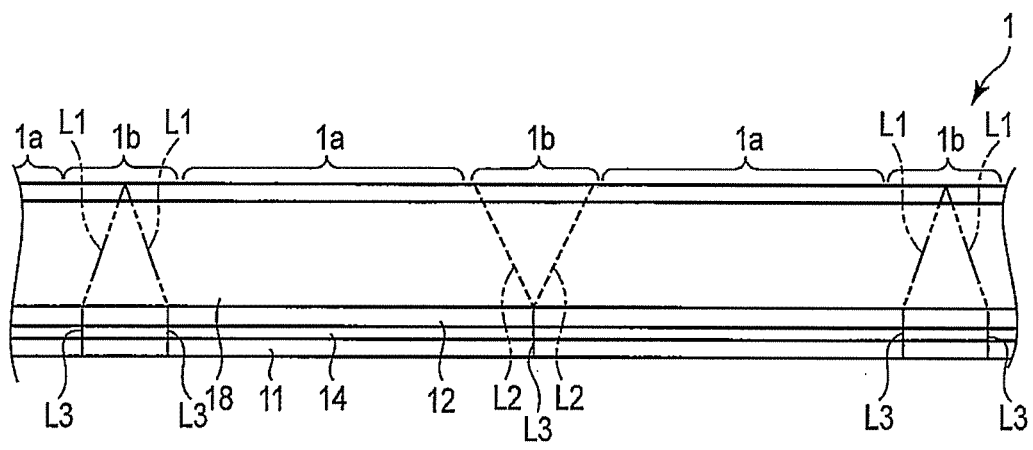
FIG. 25 is a development view of the solar cell device shown in FIG. 24.

The solar cell device 1 of this solar cell module has a structure exemplarily shown in FIG. 24. As shown in FIG. 25, this structure is obtained by forming notches at the positions of lines L3, making mountain folds at the positions of lines L1, and making valley folds at the positions of lines L2.

In the solar cell device 1, the edge of the first portion 1*a* on the side of pads 15 and 16 is folded parallel to the longitudinal direction of the solar cell device 1, so that the front surface of the solar cell device 1 protrudes. Also, the solar cell device 1 is folded at the position of the second portion 1*b* so that the edges of two adjacent first portions 1*a* on the side of the pads 15 and 16 oppose back to back. Each pair of the edges arranged back to back is inserted into one of the grooves of the member 21.

This solar cell module does not include the portion S shown in FIG. 20. Therefore, a higher power conversion efficiency can be achieved by adopting this structure.

The length of the notch formed at the position of the line L3 is properly adjustable. When the length of the notch is limited to be less than the distance from the edge of the above-mentioned structure to a active layer 13 as shown in FIG. 25, the sealing performance does not deteriorate, and this is advantageous in respect of the life.

Also, when the length of the notch is limited to be less than the distance from the edge of the above-mentioned structure to the back electrode 12, the area ratio of the active layer 13 in the slope increases, and this is advantageous in respect of the power conversion efficiency. In this case, it is favorable to perform a process of sealing an end face produced when the notch is formed. When using a notching means that generates heat such as a laser cutter or ultrasonic cutter, at least one of a light-transmitting substrate 10, sealing layer 17, and encapsulating substrate 18 thermally melts and seals the end face. When an inclination θ of the light-receptive surface is set at, e.g., 70° in this case, the first portion 1*a* is folded at a bend angle of 20°. No electrical short circuit occurs between electrodes at an angle like this.

The bend angle of the first portion 1*a* before it is supported by the support structure 2 is desirably larger by, e.g., 1° to 30° than that of the first portion 1*a* in the solar cell module. In this structure, adjacent first portions 1*a* readily come in tight contact with each other at the peak portion of the multi-slope structure, and this makes it possible to narrow a region that does not contribute to power conversion. Note that if the bend angle of the first portion 1*a* before it is supported by the support structure 2 is made excessively larger than that of the first portion 1*a* in the solar cell module, the first portion 1*a* is curved, and this may expand a region where the inclination deviates from a desired inclination or cause an electrical short circuit between electrodes.

Furthermore, in this solar cell module, the solar cell device 1 is not bent but folded at the position of the second portion 1*b*. When the second portion 1*b* is folded, it is readily possible to set, e.g., the inclination of the first portion 1*a* at a designed value, and shorten the length of the second portion 1*b*, when compared to the structure in which the second portion 1*b* is bent. Since a maximum bend angle of the second portion 1*b* is 90°, an electrical short circuit between electrodes relatively hardly occurs.

Means and processes arbitrarily applicable to all the embodiments described above will now be explained.

A process of removing dirt from the solar cell module surface can be performed. This makes it possible to prevent the adhesion of dirt to the organic thin-film solar cell for long periods of time, and prevent the decrease in power conversion efficiency. This process can be performed by, e.g., the following methods.

AC Cleaning Method:

Dirt such as dust easily deposits on particularly the bottom of the trough in the multi-slope structure, so it is desirable to take a measure to remove dust. For the deposition of particularly fine particles such as dust, it is effective to remove and transfer the fine particles by using an electric field. Line-like electrode wires are arranged with an interval of about 1 to 10 mm on the surface of an insulating protective film, which is the cell surface, and a voltage is applied between these electrode wires so that the direction of an electric field changes with time. Consequently, the charged fine particles on the cell surface vibrate in accordance with the fluctuation in electric field to come unstuck. In addition, when a progressive wave that spatially progresses is used as the electric field between the electrodes, it is possible to transfer the unstuck fine parties in a specific direction and remove them from the cell surface. The electric field between adjacent electrodes is preferably 20 to 500 V/mm, and more preferably 100 to 200 V/mm. It is also possible to apply an AC voltage having a phase shift of about 90° to 180° between adjacent electrodes, and allow this voltage to propagate as a progressive wave between the electrodes. Furthermore, when the above-mentioned electric field is periodically applied between auxiliary lines of the cell, cleaning can be performed without forming any new electrode.

Surface Self-Cleaning Layer Using Titanium Oxide:

When a photo-oxidizing titanium oxide layer is formed on the outermost layer of the solar cell module, it is possible to perform cleaning by promoting the decomposition of an adhered organic substance, thereby removing dirt from the surface.

Others:

It is also possible to form a slit having a width of about 0.5 to 2 mm along the trough line on each bottom of the troughs of the multi-slope structure and cause relatively large dust particles having a size of a millimeter unit to fall through this slit to the outside the cell. This method is also effective as a measure to remove dust.

A tracking device or light intensity detector can also be installed as an attachment. When installing the aforementioned solar cell module on, e.g., the roof of a house, a maximum effect can be obtained by using a solar tracker that causes the module to look straight to the sun.

When using the solar cell module in a mobile apparatus or the like, the user can freely adjust the angle to a light source. The power conversion efficiency can be increased by installing a circuit for displaying a direction in which the intensity of light emitted by the light source is high. For example, a liquid crystal level meter that displays light intensity is effective.

Next, the power conversion principle of the organic thin-film solar cell will be explained.

FIG. 26 is a view for explaining the operation mechanism of a bulk-heterojunction type solar cell. In FIG. 26, reference numerals 13*p* and 13*n* respectively denote p- and n-type semiconductors. Also, reference symbols CP and CE respectively represent a hole and electron.

The power conversion process of the organic thin-film solar cell is roughly divided into step a) in which organic molecules absorb light and generate excitons, step b) in which the excitons move and diffuse, step c) in which the excitons separate into holes and electrons, and step d) in which the holes and electrons are transported to electrodes.

In step a), a p- or n-type semiconductor absorbs light to generate excitons. Let $\eta 1$ be the generation efficiency. In step b), the generated excitons move to a pn junction by diffusion. Let $\eta 2$ be the diffusion efficiency. Since excitons have a lifetime, they can move only about the diffusion length. In step c), the excitons having reached the pn junction separate into holes CP and electrons CE. Let $\eta 3$ be the exciton separation efficiency. Finally, in step d), the holes CP and electrons CE are transported to the electrodes via the p-type semiconductor 13*p* and n-type semiconductor 13*n*, respectively, and extracted to an external circuit. Let $\eta 4$ be the transportation efficiency.

The external extraction efficiency that is the ratio of the holes CP or electrons CE extracted to the external circuit to photons with which the solar cell is irradiated can be represented by the following equation. This value is equivalent to the quantum efficiency of the solar cell.

$$\eta EQE = \eta 1 \times \eta 2 \times \eta 3 \times \eta 4$$

To increase the power conversion efficiency, the organic thin-film solar cell device need only be designed by taking account of the phenomena occurring in steps a) to d). That is, for step a), the active layer desirably absorbs incident photons at a high efficiency, e.g., 100%. For steps b) and c), the mobility of the semiconductors is desirably high, and the area of the interface corresponding to the pn junction is desirably large. For step d), the distance from the pn junction to each electrode is desirably short, and no defect that traps a carrier desirably exists.

Although an organic thin-film solar cell designed by taking account of these factors can achieve a high efficiency, this efficiency obtained by the existing materials and film deposition methods is still much lower than an expected efficiency. Compared to an inorganic solar cell, an organic thin-film solar cell has a low exciton dissociation probability, short exciton diffusion length, and low carrier mobility. This is so because an organic semiconductor has many parameters that are difficult to control, such as the purity, molecular weight distribution, and orientation.

To improve step a), a means for increasing the photon absorptance by thickening the active layer is possible. When the active layer is thickened, the photon absorptance increases because the optical path length increases. However, the electrical resistance increases as the thickness of the active layer increases, and this makes carriers easier to trap. Consequently, the generated carriers cannot reach the electrodes, and the power conversion efficiency decreases.

Also, to improve step d), a means for shortening the distance between the electrodes by thinning the active layer is possible. When the distance between the electrodes is shortened, the generated carriers readily reach the electrodes, and the electrical resistance of the film decreases. This seems to increase the power conversion efficiency. When the active layer is thin, however, the amount of excitons generated in step a) decreases for the following reason. That is, the material used in the active layer does not have high light absorptivity. If the film thickness is small, therefore, some photons are not absorbed by the active layer but escape to the outside. This decreases the number of carriers, and reduces an electric current. As a consequence, the power conversion efficiency decreases.

As described above, when the active layer is thickened, the number of generated excitons increases, but the efficiency of transportation of the carriers to the electrodes decreases. On the other hand, when the active layer is thinned, the efficiency of transportation of the carriers to the electrodes increases, but the number of generated excitons decreases. Accordingly, no high power conversion efficiency can be achieved in either case.

By contrast, the optical path length of the active layer can be increased by inclining the light-receptive surface of the first portion 1a, while the film thickness of the active layer is maintained within a range optimum for the efficiency of transportation of the carriers to the electrodes. This makes it possible to increase the power conversion efficiency without posing any problems as described above.

The constituting members of the solar cell module will be explained below.

(Light-Transmitting Substrate and Encapsulating Substrate)

The light-transmitting substrate 10 and encapsulating substrate 18 support other constituting members. These substrates are preferably not modified by heat and organic solvents. Examples of the substrate material are plastics or polymers such as polyethylene, PET, PEN, PI, polyamide, polyamidoimide, a liquid crystal polymer, and a cycloolefin polymer, metals such as stainless steel (SUS), silicon, and other inorganic materials such as non-alkali glass and quartz glass. Since the light-transmitting substrate 10 is placed on the light incident side, a transparent material is typically used. A non-transparent substrate may be used as the encapsulating substrate 18.

(Front Electrode)

The front electrode 11 is an anode in this embodiment. The front electrode 11 is stacked on the substrate 10. The material of the front electrode 11 is not particularly limited as long as the material is conductive. The front electrode 11 is normally obtained by forming a layer made of a transparent or semi-transparent conductive material by using, e.g., vacuum evaporation, sputtering, ion plating, plating, or coating. Examples of the layer made of a transparent or semitransparent material are a conductive metal oxide film and semitransparent thin metal film. More specifically, it is possible to use a layer made of conductive glass (e.g., NESA) such as fluorine-doped tin oxide (FTO), indium zinc oxide, zinc oxide, indium oxide, tin oxide, and indium tin oxide as a composite material thereof; or a layer made of gold, platinum, silver, or copper. ITO or FTO is particularly favorable. As the electrode material, it is also possible to use polyaniline or its derivative or polythiophene or its derivative, as an organic conductive polymer. When using ITO, the film thickness of the front electrode 11 is preferably 30 to 300 nm. If the film thickness is smaller than 30 nm, the resistance may increase because the conductivity decreases, and this decreases the power conversion efficiency. If the film thickness is larger than 300 nm, the light transmittance may decrease. In addition, cracking easily occurs owing to stress because the flexibility decreases. The sheet resistance of the front electrode 11 is preferably as low as possible, and favorably 10Ω/□ or less. The front electrode 11 can be a single layer, and can also be obtained by stacking layers made of materials having different work functions. To reduce an electrical short circuit and current leak between the front electrode 11 and the back electrode 12, the surface of the front electrode 11 is preferably smooth.

(Hole Transport/Injection Layer)

The hole transport/injection layer is arbitrarily deposited between the front electrode 11 as an anode and the active layer 13. The functions of the hole transport/injection layer are, e.g., to prevent an electrical short circuit in the solar cell device 1 by leveling the rough surface of the lower electrode, efficiently transport only holes, and prevent the extinction of excitons generated near the interface of the active layer 13. As the material of the hole transport/injection layer, it is possible to use a polythiophene based polymer such as PEDOT/PSS, or an organic conductive polymer such as polyaniline or polypyrrol. Examples of typical products of the polythiophene based polymer are Clevios PH500, Clevios PH, Clevios PV P Al 4083, and Clevios HIL1.1 manufactured by Starck.

When using Clevios PH500 as the material of the hole transport/injection layer, the film thickness is preferably 20 to 100 nm. If the hole transport/injection layer is too thin, the leveling effect may become insufficient, and an electric short circuit may occur. If the hole transport/injection layer is too thick, the film resistance increases, and this may decrease the power conversion efficiency.

A film deposition method of the hole transport/injection layer is not particularly limited, provided that the method can form thin films. The hole transport/injection layer can be deposited by, e.g., slit coating or meniscus coating. After the material of the hole transport/injection layer is applied such that a film having a desired thickness is deposited, the film is dried by heating by using a hotplate or the like. This drying by heating is preferably performed at 140° C. to 200° C. for about a few min to 10 min. A solution to be applied is desirably passed through a filter beforehand.

(Active Layer)

The active layer 13 is provided between the front electrode 11 and back electrode 12. The active layer 13 will be explained below by taking a bulk-heterojunction type organic thin-film solar cell as an example. The bulk-heterojunction type solar cell has the feature that a p-type semiconductor 13p and n-type semiconductor 13n take a phase separated structure in the active layer. In the bulk-heterojunction type, the mixed p- and n-type semiconductors 13p and 13n form a nano-order pn junction in the active layer, and an electric current is obtained by using photo-induced charge separation occurring on the junction surface. The p-type semiconductor 13p is made of a material having electron-donating properties. On the other hand, the n-type semiconductor 13n is made of a material having electron-accepting properties. For example, at least one of the p-type semiconductor 13p and n-type semiconductor 13n is an organic semiconductor.

As the p-type organic semiconductor, it is possible to use, e.g., polythiophene or its derivative, polypyrrol or its derivative, a pyrazoline derivative, an arylamine derivative, a stilbene derivative, a triphenyldiamine derivative, oligothiophene or its derivative, polyvinylcarbazole or its derivative, polysilane or its derivative, a polysiloxane derivative having aromatic amine on a side chain or main chain, polyaniline or its derivative, a phthalocyanine derivative, porphyrin or its derivative, polyphenylenevinylene or its derivative, or polythienylenevinylene or its derivative, and these materials can also be used together. It is also possible to use copolymers of these materials. Examples of the copolymers are a thiophene-fluorene copolymer and phenyleneethynylene-phenylenevinylene copolymer.

A preferable p-type organic semiconductor is polythiophene or its derivative as a conductive polymer having π conjugation. Polythiophene and its derivative can maintain a high stereoregularity, and have a relatively high solubility in a solvent. Polythiophene and its derivative are not particularly limited as long as they are compounds having a thiophene unit. Practical examples of polythiophene and its derivative are polyalkylthiophenes such as poly(3-methylthiophene), poly(3-butylthiophene), poly(3-hexylthiophene), poly(3-octylthiophene), poly(3-decylthiophene), and poly(3-dodecylthiophene); polyarylthiophenes such as poly(3-phenylthiophene) and poly(3-p-alkylphenylthiophene); polyalkylisothionaphthenes such as poly(3-butylisothionaphthene), poly(3-hexylisothionaphthene), poly(3-octylisothionaphthene), and poly(3-decylisothionaphthene); and polyethylenedioxythiophene.

Recently, a derivative such as poly[N-9''-hepta-decanyl-2,7-carbazole-alt-5,5-(4',7'-di-2-thienyl-2',1',3'-benzothiadiazole)] (PCDTBT) as a copolymer containing carbazole, benzothiadiazole, and thiophene is known as a compound by which a high power conversion efficiency is obtained.

A layer made of any of these conductive polymers can be deposited by applying a solution prepared by dissolving the polymer in a solvent. Accordingly, a large area organic thin-film solar cell can be manufactured with an inexpensive installation at a low cost by using a coating method or the like.

As the n-type organic semiconductor, fullerene or its derivative is suitably used. A fullerene derivative used herein is not particularly limited as long as the derivative has a fullerene unit. A practical example is a derivative formed by using C60, C70, C76, C78, or C84 as a basic unit. In the fullerene derivative, carbon atoms in the fullerene unit may be modified by arbitrary functional groups, and these functional groups may combine to form a ring. The fullerene derivative includes a fullerene bonded polymer. A fullerene derivative that contains a functional group having high affinity for a solvent and hence is highly soluble in a solvent is favorable.

Examples of the functional group in the fullerene derivative are hydrogen atom; hydroxyl group; halogen atoms such as fluorine atom and chlorine atom; alkyl groups such as methyl group and ethyl group; alkenyl groups such as vinyl group; cyano group; alkoxy groups such as methoxy group and ethoxy group; aromatic hydrocarbon groups such as phenyl group and naphthyl group; and aromatic heterocyclic groups such as thienyl group and pyridyl group. Practical examples are hydrogenated fullerenes such as C60H36 and C70H36, oxide fullerenes such as C60 and C70, and fullerene metal complexes.

Among other materials, it is particularly favorable to use [6,6]-phenyl C61 butyric acid methyl ester (60PCBM) or [6,6]-phenyl C71 butyric acid methyl ester (70PCBM) as the fullerene derivative.

C70 is preferably used when using unmodified fullerene. Fullerene C70 has a high photo-carrier generation efficiency, and is suitable for use in the organic thin-film solar cell.

The mixing ratio of the n-type organic semiconductor and p-type organic semiconductor in the active layer is preferably about 1 when the p-type semiconductor is a P3HT-based semiconductor. When the p-type semiconductor is a PCDTBT-based semiconductor, the mixing ratio of the n-type organic semiconductor and p-type organic semiconductor is preferably about 4.

When applying an organic semiconductor, the organic semiconductor is usually dissolved in a solvent. Examples of the solvent are unsaturated hydrocarbon-based solvents such as toluene, xylene, tetralin, decalin, mesitylene, n-butylbenzene, sec-butylbenzene, and tert-butylbenzene; halogenated aromatic hydrocarbon-based solvents such as chlorobenzene, dichlorobenzene, and trichlorobenzene; halogenated saturated hydrocarbon-based solvents such as carbon tetrachloride, chloroform, dichloromethane, dichloroethane, chlorobutane, bromobutane, chloropentane, chlorohexane, bromohexane, and chlorocyclohexane; and ethers such as tetrahydrofuran and tetrahydropyran. Halogen-based aromatic solvents are particularly favorable. These solvents can be used singly or in the form of a mixture.

Examples of a method of depositing a wet film of the solution are spin coating, dip coating, casting, bar coating, roll coating, wire bar coating, spraying, screen printing, gravure printing, flexographic printing, offset printing, gravure offset printing, dispenser coating, nozzle coating, capillary coating, and an inkjet method. These coating methods can be used singly or in combination.

(Electron Transport/Injection Layer)

The electron transport/injection layer is arbitrarily deposited between the back electrode 12 and active layer 13. The electron transport/injection layer has a function of efficiently transporting electrons alone by blocking holes, and a function of preventing the extinction of excitons generated at the interface between the active layer 13 and electron transport/injection layer.

An example of the material of the electron transport/injection layer is a metal oxide, e.g., amorphous titanium oxide obtained by hydrolyzing titanium alkoxide by the sol-gel process. The film deposition method is not particularly limited as long as thin films can be deposited. Examples of the film deposition method are slit coating and meniscus coating. When using titanium oxide as the material of the electron transport/injection layer, the electron transport/injection layer is desirably deposited to have a thickness of 5 to 20 nm. If the film thickness is smaller than this range, the hole blocking effect reduces. Accordingly, generated excitons may be deactivated before they dissociate into electrons and holes, and this may make it impossible to efficiently extract an electric current. If the film thickness is too large, the film resistance increases, and this may make the power conversion efficiency insufficient. A coating solution is desirably passed through a filter beforehand. After a wet film of the solution is deposited to have a predetermined film thickness, the film is dried by heating by using a hotplate or the like. For example, the film is dried by heating at 50° C. to 100° C. for a few min to 10 min while accelerating hydrolysis in the air.

(Back Electrode)

The back electrode 12 is a cathode in this embodiment. The back electrode 12 is stacked on the active layer 13 (or the electron transport/injection layer). The back electrode 12 is obtained by depositing a conductive material by, e.g., vacuum evaporation, sputtering, ion plating, plating, or coating. The back electrode 12 is, e.g., a conductive thin metal film or metal oxide film. The back electrode 12 can also be deposited by using conductive paste obtained by dispersing fine particles made of the above-mentioned material in a binder. It is also possible to use an organic conductive polymer, e.g., polyaniline or its derivative, or polythiophene or its derivative. When depositing the front electrode 11 by using a material having a high work function, it is preferable to use a material having a low work function as the back electrode 12. Examples of the material having a low work function are an alkali metal and alkaline-earth metal. Practical examples are Li, In, Al, Ca, Mg, Sm, Tb, Yb, Zr, Na, K, Rb, Cs, Ba, and their alloys.

The back electrode 12 can be a single layer, and can also be deposited by stacking layers made of materials having different work functions. As the material of the back electrode 12, it is possible to use an alloy containing one or more materials having low work functions, and one or more of gold, silver, platinum, copper, manganese, titanium, cobalt, nickel, tungsten, and tin. Examples of the alloy are a lithium aluminum alloy, lithium magnesium alloy, lithium indium alloy, magnesium silver alloy, magnesium indium alloy, magnesium aluminum alloy, indium silver alloy, and calcium aluminum alloy.

The film thickness of the back electrode 12 is, e.g., 1 to 1,000 nm, and preferably 10 to 500 nm. If the film thickness of the back electrode 12 is small, the resistance increases, and this may make it impossible to sufficiently extract generated charge to an external circuit. If the film thickness of the back electrode 12 is large, a large amount of material should be used. This prolongs the occupation time of the film deposition apparatus, and may increase the cost.

Practical examples relevant to the above-described embodiments will be described below.

<Preliminary Experiment>

The purpose of this preliminary experiment is to explain the effect of arranging solar cell devices into a V shape. In the preliminary experiment, a pair of solar cell devices were manufactured. These solar cell devices were arranged into a V configuration such that their light-receptive surfaces obliquely opposed each other, and the current-voltage characteristics were measured. The inclinations which the light-receptive surfaces made with a plane perpendicular to the light incident direction were set at 80°, 70°, 60°, and 45°. Also, these solar cell devices were arranged such that their light-receptive surfaces were perpendicular to the light incident direction, and the current-voltage characteristics were measured. Based on these results, the influence of the inclination of the light-receptive surface on the power conversion efficiency was checked.

(Manufacture of Solar Cell Device)

First, the manufacture of the solar cell devices will be explained.

10 parts by mass of a p-type organic semiconductor and 40 parts by mass of an n-type organic semiconductor were mixed. As the p-type organic semiconductor, PCDTBT, i.e., poly[N-9''-hepta-decanyl-2,7-carbazole-alt-5,5-(4',7'-di-2-thienyl-2',1',3'-benzothiadiazole)] manufactured by 1-MATERIAL was used. As the n-type organic semiconductor, 70PCBM, i.e., [6,6]-phenyl C71 butyric acid methyl ester manufactured by SOLENNE was used.

Then, 1 mL of ortho-dichlorobenzene as a solvent and 30 mg of the above-mentioned mixture were placed in a bottle. This solution mixture was irradiated with ultrasonic waves at 50° C. for 2 hrs by using an ultrasonic cleaner (US-2 manufactured by IUCHI SEIEIDO), thereby obtaining a coating solution. This coating solution was passed through a filter capable of filtering out particles having particle sizes of 0.2 μm or more.

A 20×20-mm glass plate having a thickness of 0.7 mm was used as a substrate. 140 nm-thick ITO was deposited on this glass plate by sputtering. This ITO layer was patterned into a 3.2×20 mm-rectangular shape by photolithography. Thus, an anode made of ITO was formed on the glass plate.

This glass plate was ultrasonically cleaned with pure water containing 1% of a surfactant (NCW 1001 manufactured by Wako Pure Chemical) for 5 min, and subsequently washed with running pure water for 15 min. The glass plate was then ultrasonically cleaned with acetone for 5 min, and subsequently ultrasonically cleaned with isopropanol (IPA) for 5 min. After that, the glass plate was dried in a constant temperature oven at 120° C. for 60 min. In addition, a UV treatment was performed on this glass plate for 10 min, thereby hydrophilizing the surface.

Then, the glass plate with ITO was coated with an aqueous PEDOT/PSS solution by spin coating. As the aqueous PEDOT/PSS solution, Clevios PH500 manufactured by Starck was used. Before coating, the aqueous solution was passed through a filter capable of filtering out particles having particle sizes of 0.1 μm or more. The coating film was dried at 200° C. for 5 min by using a hotplate, thereby obtaining a 60 nm-thick hole transport/injection layer.

Subsequently, the active layer was coated on the hole transport/injection layer by spin coating in a nitrogen-purged glove box. This coating film was dried in a nitrogen ambient at 70° C. for 60 min by using a hotplate, thereby obtaining a 90 nm-thick active layer.

After that, an amorphous titanium oxide layer was deposited as an electron transport/injection layer by the sol-gel process. More specifically, 5 mL of titanium isopropoxide, 25 mL of 2 methoxyethanol, and 2.5 mL of ethanolamine were mixed in a nitrogen-purged three neck flask having an internal capacity of 50 mL and including a stirring mechanism, refluxing device, and temperature-adjusting mechanism, and the solution mixture was refluxed at 80° C. for 2 hrs and then refluxed at 120° C. for 1 hr. A titanium oxide precursor solution thus obtained was diluted to 150 times the volume with IPA, and passed through a filter capable of filtering out particles having particle sizes of 0.2 μm or more.

This solution was coated on the active layer by spin coating. The coating film was dried at 80° C. for 10 min by using a hotplate, thereby obtaining a 20 nm-thick electron transport/injection layer. Note that the solution-coating and film-drying were performed in the air in order to accelerate hydrolysis for generating titanium oxide by using water contained in the air.

Then, a cathode was deposited by using a vacuum evaporation apparatus. More specifically, the glass plate with ITO on which the electron transport/injection layer, etc. were deposited was held by a holder, a mask was overlaid on the glass plate, and these were placed in the evaporation apparatus. The mask used herein had a 3.2 mm-wide rectangular slit. The mask was placed so that the ITO layer and slit crossed each other. After that, the evaporation apparatus was evacuated to a vacuum degree of $3 \times 10^{-6}$ torr, and a wire material made of aluminum was resistance-heated, thereby obtaining an 80 nm-thick aluminum layer as a cathode.

After that, this glass plate was annealed at 150° C. for 30 min by using a hotplate.

Subsequently, this glass plate and encapsulating glass having one major surface recessed by excavating were adhered by using an epoxy polymer such that the recessed surface of the encapsulating glass opposed the cathode. In addition, extracting electrodes were attached to the anode and cathode, thereby completing an organic thin-film solar cell device. Note that the area of the active region of this solar cell device was 0.1024 $cm^2$ (3.2 mm×3.2 mm).

(Test 1)

The pair of solar cell devices obtained by the above-described method were arranged into a V configuration such that their light-receptive surfaces obliquely opposed each other (an inclined configuration), and the current-voltage characteristics were measured. In this test, the inclination mentioned earlier was set at 80°. Also, these solar cell devices were arranged such that their light-receptive surfaces were perpendicular to the light incident direction (a horizontal configuration), and the current-voltage characteristics were measured.

The current-voltage characteristics were measured by an electronic load by using an electrical output measurement apparatus manufactured by MAKI MANUFACTURING. A solar simulator capable of regenerating AM1.5 was used as a measurement light source, and the irradiation illuminance was set at 100 mW/cm$^2$. Note that the power conversion efficiency was calculated based on the experimental fact that the relationship between the incident light intensity and power conversion efficiency is linear over a broad light intensity range in an organic thin-film solar cell device.

Figure 27:
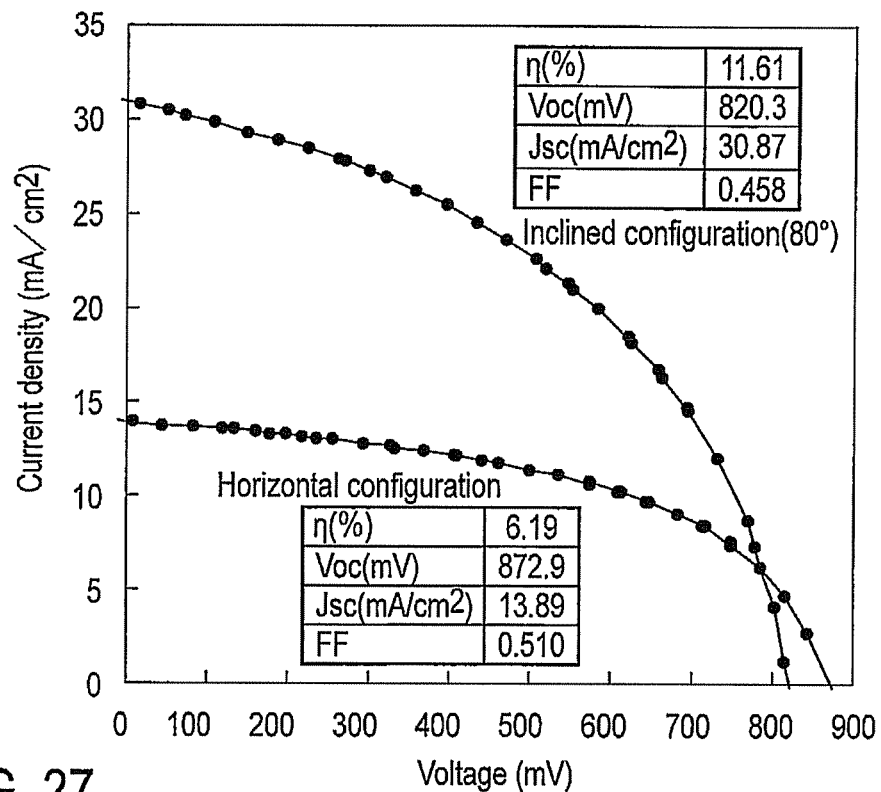
FIG. 27 is a graph showing the current-voltage characteristics of an inclined configuration and horizontal configuration.

FIG. 27 shows the results. Note that in the inclined configuration, at least a part of light reflected by one solar cell device can enter the other solar cell device. In this case, therefore, not only light having directly entered the device from the light source but also light reflected by the device contribute to the current-voltage characteristics.

In the horizontal configuration, the power conversion efficiency was 6.19%. When using the inclined configuration and setting the inclination at 80°, the power conversion efficiency was 11.61%. That is, the power conversion efficiency of the inclined configuration was about 1.9 times that of the horizontal configuration. Also, a current density JSC was 30.87 mA/cm$^2$ in the inclined configuration. This current density $J_{SC}$ was about 2.2 times the value obtained by the horizontal configuration.

Figure 28:
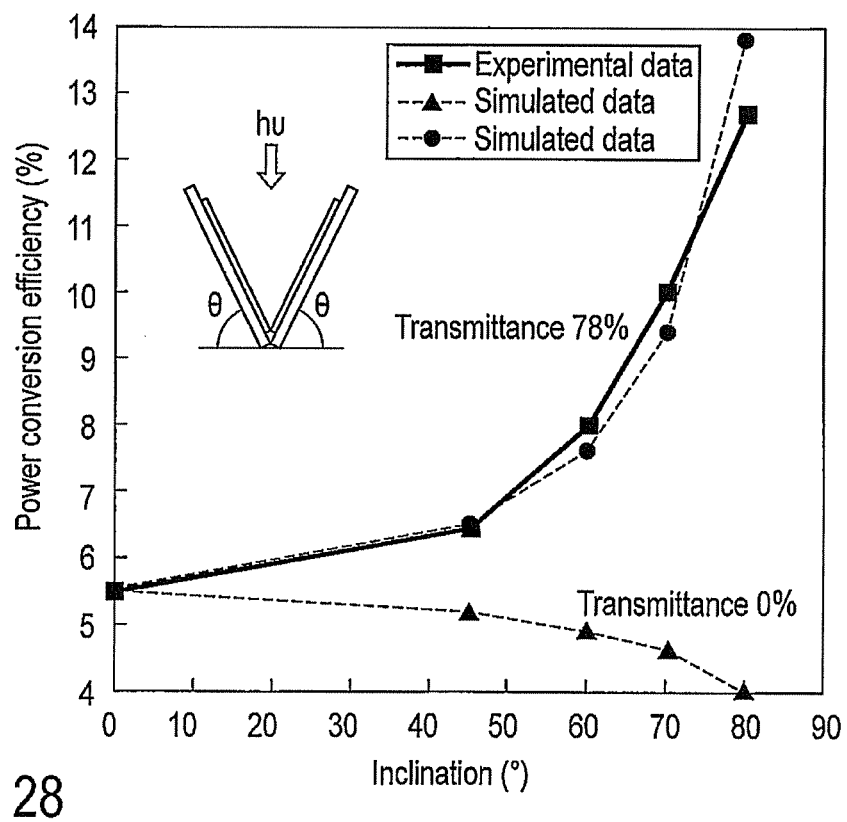
FIG. 28 is a graph showing the relationship between an inclination θ of a light-receptive surface and the power conversion efficiency.

The power conversion efficiency was then obtained by changing the inclination. FIG. 28 shows the relationship between the inclination θ and power conversion efficiency.

Referring to FIG. 28, the solid line indicates the result obtained by the experiment, and the broken line indicates the result obtained by simulation. This simulation was performed on a model obtained by taking account of the contribution of light having directly entered the device from the light source and the contribution of light that was reflected by one device and entered the other device.

When the inclination θ was changed from 0° to 45°, the rise in power conversion efficiency was small. The power conversion efficiency largely rose when the inclination θ was changed from 45° to 60°, and was very high when the inclination θ was 70° to 80°.

Then, simulation was performed to check an optimum value of the light transmittance of the active layer. More specifically, the amount of light absorbed by the active layer was obtained based on, e.g., experimental data of the absorption coefficient, refractive index, and light transmittance of each layer of the solar cell device manufactured in the preliminary experiment, thereby calculating the power conversion efficiency. FIG. 28 shows that the result obtained by simulation in which the light transmittance of the active layer was 78% relatively well reproduced the experimental result. Also, when the active layer completely absorbed light, i.e., when the light transmittance of the active layer was 0%, the power conversion efficiency decreased when the solar cell device was inclined.

(Simulation of Efficiency Distribution in Solar Cell Device)

In the inclined configuration, light entering from above is reflected by the cell surface and concentrated to the bottom of the V-shaped trough. Accordingly, the light intensity presumably increases toward the bottom of the V-shaped trough, so the power conversion efficiency probably increases toward the bottom of the V-shaped trough. To reveal this, the power conversion efficiency distribution in the cell was simulated by calculating an optical path in the inclined configuration. In this simulation, an inclined configuration in which the solar cell devices (cells) manufactured by the preliminary experiment were arranged at an inclination of 80° was assumed.

Figure 29:
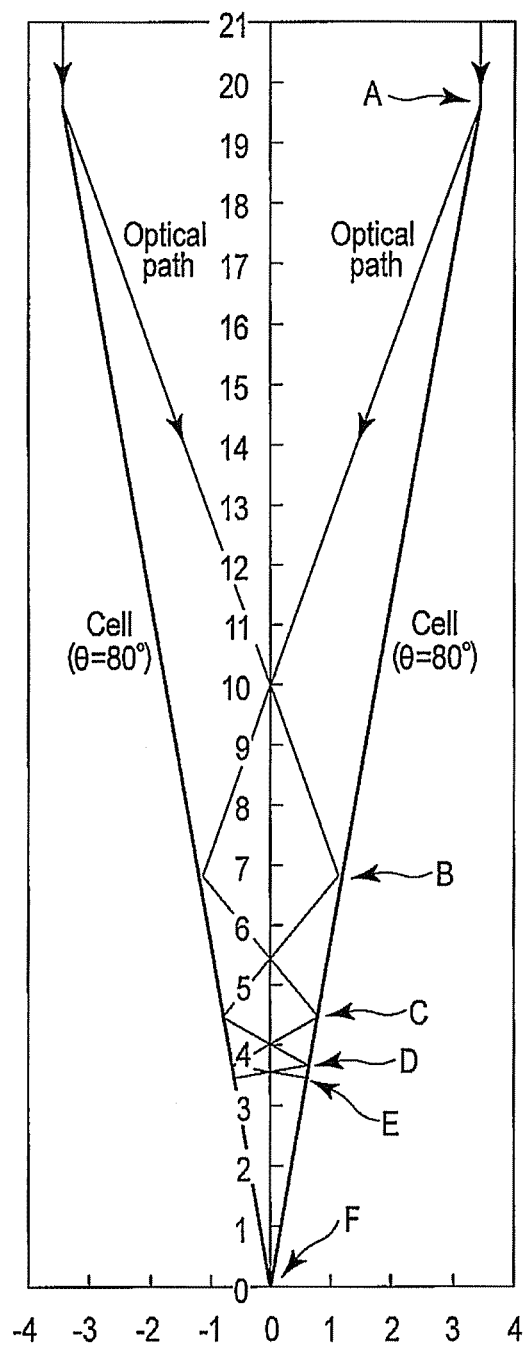
FIG. 29 is a view showing optical paths when solar cell devices arranged into a V configuration are irradiated with light.

FIG. 29 is a view showing optical paths in the inclined configuration. First, the optical path of light vertically entering a point A from above in the uppermost portion of a right-hand cell in FIG. 29 is as follows. When the inclination θ of the cell is 80°, light having entered the point A of the right-hand cell at an incident angle of 10° is reflected by the point A. This primary-reflected light enters the position of the left-hand cell that opposes a point B at an incident angle of 30°. The reflected light enters, as secondary-reflected light, a point C of the right-hand cell. Similarly, light having entered the uppermost portion of the left-hand cell is reflected and enters the point B of the right-hand cell at an incident angle of 30°. This reveals that in a region from the point A to the point B of the right-hand cell, the light from the light source directly enters, and no reflected light enters. In a region from the point B to the point C, the light from the light source directly enters, and the primary-reflected light also enters.

Figure 30:
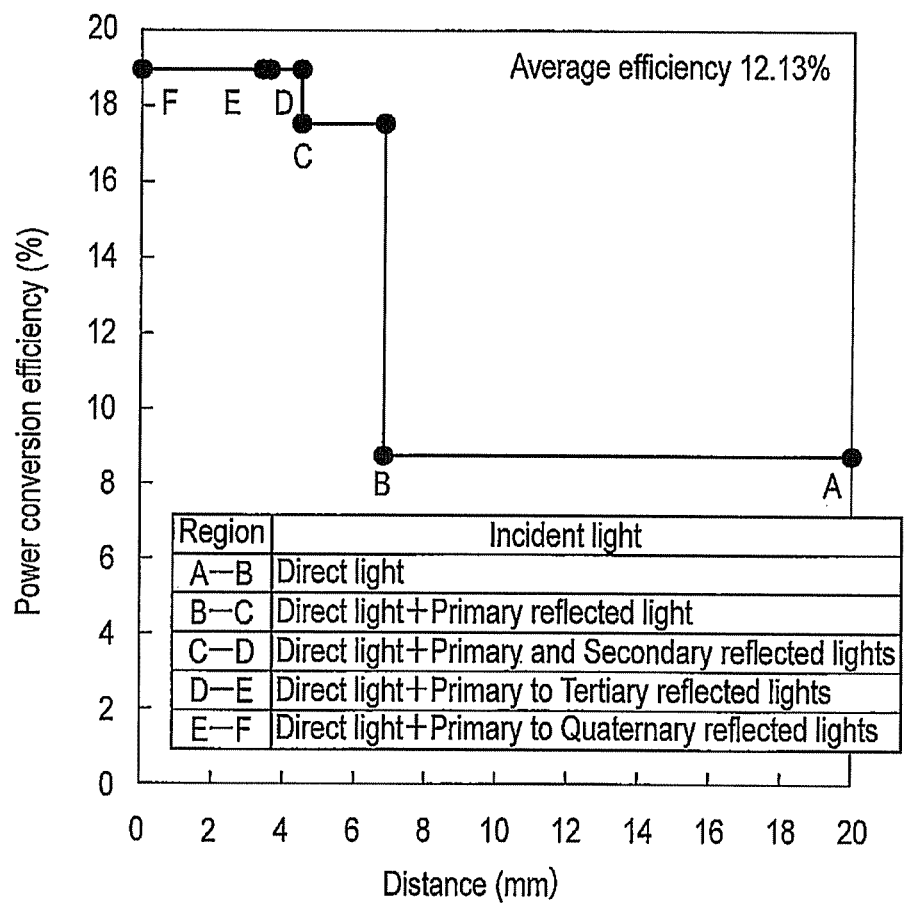
FIG. 30 is a graph showing the calculation results of the power conversion efficiency distribution of the solar cell devices arranged into a V configuration.

FIG. 30 shows the calculation result of the power conversion efficiency distribution in the power conversion element when using the inclined configuration. Symbols A to F in FIG. 30 correspond to the symbols shown in FIG. 29. 8.7% obtained as a measurement value was used as the power conversion efficiency in a region from the point A to the point B. The power conversion efficiency of each of a region from the point B to the point C, a region from the point C to the point D, a region from the point D to the point E, and a region from the point E to the point F was a value obtained by a calculation. Note that as shown in FIG. 29, the change in angle of incident light to the cell caused by the repetition of reflection and incidence was also taken into account in the calculations.

In the region from the point B to the point C, the influence of the primary-reflected light on the power conversion efficiency was large, so the power conversion efficiency was about twice that in the region from the point A to the point B. In the region from the point E to the point F, the power conversion efficiency reached 19.0%. This result shows that in the inclined configuration, the power conversion efficiency distribution exists in the cell as expected, so a measurement position demands attention in the measurement of the efficiency.

EXAMPLE 1

An organic thin-film solar cell module in which a solar cell device formed the multi-slope structure was manufactured by the same method as described with reference to FIGS. 6 to 10.

More specifically, a 150 nm-thick ITO layer was first deposited on a 150 μm-thick PEN substrate by sputtering. The substrate had a width of 28 mm and a length of 420 mm. Then, a 6 mm-wide polyimide film was formed as an insulating layer 14 on the ITO layer by photolithography by using DL 1000 manufactured by TORAY.

Figure 31:
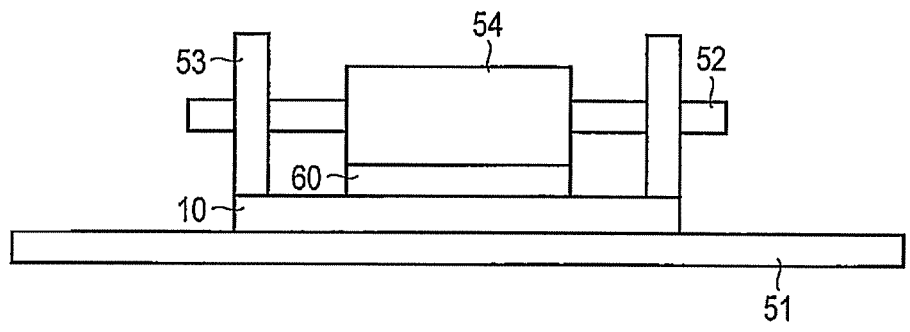
FIG. 31 is a front view showing an example of an apparatus usable in a meniscus coating method.

Subsequently, while the ribbon-like substrate was continuously supplied to a coating unit, a hole transport/injection layer, active layer, and electron transport/injection layer were sequentially deposited, and a cathode was deposited by evaporation. Immediately before the hole transport/injection layer was deposited by coating, the surface was UV-cleaned by using a UV cleaner, thereby removing foreign matter from the surface and improving the hydrophilic nature. Each layer was deposited by the meniscus coating method. FIG. 31 shows an example of an apparatus usable in the meniscus coating method. FIGS. 32, 33, and 34 respectively illustrate the first, second, and third steps of the meniscus coating method using the apparatus shown in FIG. 31.

In FIGS. 31 to 34, reference numerals 51, 52, 53, and 54 respectively denote a stage, a shaft, gap rings, and an applicator. Reference numeral 60 denotes a coating solution (ink); and 61, a layer obtained from the coating solution 60.

The coating solution was applied into a belt-like shape on a portion of a substrate 10 by using the applicator 54 narrower than the substrate 10. Before the application of the coating solution, masking tapes were adhered to the front and rear end portions of the substrate 10. These masking tapes were removed after the layer 61 was deposited. The hole transport/injection layer, active layer, and electron transport/injection layer were deposited in a region having a width of 20 mm and a length of 418 mm.

The hole transport/injection layer was deposited to have a thickness of 60 nm. As a coating solution for depositing the hole transport/injection layer, Clevios PH500 as an aqueous PEDOT/PSS solution manufactured by Starck was used. The coating film obtained from this coating solution was dried by using a blower capable of generating hot air at 110° C.

The active layer was deposited to have a thickness of 90 nm. A coating solution for depositing the active layer was prepared by the following method. First, 10 parts by mass of a p-type organic semiconductor and 40 parts by mass of an n-type organic semiconductor were mixed. PCDTBT manufactured by 1-MATERIAL was used as the p-type organic semiconductor. 70PCBM manufactured by SOLENNE was used as the n-type organic semiconductor. Then, 1 mL of ortho-dichlorobenzene as a solvent and 30 mg of the aforementioned mixture were placed in a bottle. This solution mixture was irradiated with ultrasonic waves at 50° C. for 2 hrs by using an ultrasonic cleaner (US 2 manufactured by IUCHI SEIEIDO), thereby obtaining a coating solution. The active layer was deposited on the hole transport/injection layer, and drying by using a blower capable of generating hot air at 70° C.

The electron transport/injection layer was deposited to have a thickness of 20 nm. A coating solution for depositing the electron transport/injection layer was prepared by the following method. First, 5 mL of titanium isopropoxide, 25 mL of 2 methoxyethanol, and 2.5 mL of ethanolamine were mixed in a 50 mL, nitrogen purged, three neck flask including a stirring mechanism, refluxing device, and temperature adjusting mechanism, and the solution mixture was refluxed at 80° C. for 2 hrs and then refluxed at 120° C. for 1 hr. A titanium oxide precursor solution thus obtained was diluted to 150 times the volume with IPA, thereby obtaining a coating solution. The electron transport/injection layer was deposited by coating this solution on the active layer, and drying by a blower capable of generating hot air at 80° C.

A cathode was deposited to have a thickness of 80 nm by using a vacuum evaporation apparatus. More specifically, a wire material made of aluminum was resistance-heated, thereby depositing aluminum on the electron transport/injection layer through a mask. The cathode had a width of 21 mm and a length of 416 mm. To prevent an electrical short circuit, no cathode was deposited in an exposed portion of an anode.

Subsequently, a PEN substrate having a width of 20 mm and a length of 420 mm was prepared as a encapsulating substrate, and the entire surface was coated with an epoxy adhesive as a sealing material. This PEN substrate was adhered to the PEN substrate on which the cathode and the like were deposited, such that the surface on which the adhesive layer was formed and the surface on which the cathode and the like were deposited opposed each other. Note that this adhesion was performed so as to expose an anode pad and cathode pad.

The solar cell device was completed as described above. The area of a active region of this solar cell device was 70.72 cm$^2$ (416 mm×17 mm). This area was about 690 times that of a active region of the device manufactured in the preliminary experiment. Also, in the solar cell device manufactured as described above, the width of each of the anode pad and cathode pad was 3 mm, and the spacing between them was 2 mm. These dimensions are values sufficient to electrically connect these pads to contact electrodes without causing any electrical short circuit.

After that, the solar cell device was processed as described with reference to FIGS. 24 and 25. The distance between the creases L1 and L3 was set at 70 mm. The creases L1 and L3 were formed such that the inclination θ was 70°. The length of the crease L3 was set to 8 mm. The edge of the solar cell device sandwiched between the creases L3 was folded at an angle of 23° so as to form a crease parallel to the longitudinal direction of the solar cell device. This crease was not formed on the PEN substrate on which the cathode and the like were deposited, but formed on only the encapsulating substrate. Before forming these creases, shallow grooves were formed in the portions of the two surfaces of the substrate that corresponded to the lines L1 to L3 by using a cutting tool.

The solar cell device molded as described above was attached to the support structure shown in FIG. 23. Copper leaf springs were used as the contact electrodes.

Thus, a module having the multi-slope structure in which three V shapes were arranged was completed.

When a test was conducted by the same method as described above, the power conversion efficiency was 8.78%. Example 1 differs from the preliminary test (FIG. 28) in that the area of the active layer was about 690 times larger, the active layer was applied and dried in the air, a polymer was used as the substrate, and drying after coating was performed under moderate conditions accordingly. When these differences are taken into consideration, the power conversion efficiency (8.78%) achieved in this example is compared with the result (FIG. 28) of the preliminary test to obtain an equivalent result.

When the auxiliary lines are formed in order to increase the device area by about 690 times as in the comparative example shown in FIGS. 4 and 5, the auxiliary lines decrease the aperture ratio, and the power conversion efficiency extremely decreases.

By contrast, in Example 1, it was possible to reduce the influence of electrical potential drop without forming any auxiliary line, and obtain a large area solar cell module having a high power conversion efficiency by using the multi-slope structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A solar cell module comprising:
a belt-like solar cell device including first portions arranged in one direction such that major surfaces thereof face each other, and a second portion interposed between the first portions, wherein edges of the first portions that correspond to a pair of long sides of the solar cell device are parallel to each other, two adjacent first portions incline forwardly and backwardly with respect to the one direction, and the second portion including one or more planar or curved surfaces to connect the two adjacent first portions to each other; and a support structure supporting the solar cell device.

2. The module according to claim 1, wherein the support structure includes a first member provided below the solar cell device and supporting one long side of the solar cell device.

3. The module according to claim 2, wherein the support structure further includes a second member provided on the one long side of the solar cell device and fixing the solar cell device to the first member.

4. The module according to claim 3, wherein an upper surface of the second member that intervenes between the first portions of the solar cell device has a light-reflecting property.

5. The module according to claim 3, wherein the first member has a groove thereon, and a portion of the second member is inserted in the groove.

6. The module according to claim 2, wherein the first member has grooves thereon, and edges of the first portions that correspond to the one long side are inserted in the grooves.

7. The module according to claim 1, wherein
the solar cell device includes a light-transmitting substrate, a back electrode provided at the first portions, a front electrode interposed between the back electrode and the light-transmitting substrate, and a active layer interposed between the back electrode and the front electrode, and
the support structure further includes first contact electrodes in contact with the back electrode at the first portions, and second contact electrodes in contact with the front electrode at the first portions.

8. The module according to claim 1, having a hollow surrounded by the support substrate and two adjacent first portions.

9. A solar cell module comprising:
a belt-like solar cell device having front and back surfaces and including first portions arranged in a longitudinal direction of the solar cell device, and one or more second portions each interposed between adjacent two of the first portions, wherein the solar cell device is folded, bent, or folded and bent at position(s) of the one or more second portions such that edges of the first portions that correspond to a pair of long sides of the front surface are parallel to each other, the first portions are adjacent to each other in a first direction perpendicular to the edges, and each region of the front surface that correspond to adjacent two of the first portions forms a structure in which a first slope inclining toward the first direction and a second slope inclining toward a second direction opposite to the first direction are arranged in this order in one of the first and second directions; and
a support structure supporting the solar cell device.

10. The module according to claim 9, wherein the support structure includes a first member at least partially facing regions of the back surface that correspond to the first portions, and one or more second members pushing the first portions against the first member at a bottom of each trough formed by an arrangement of the first and second slopes.

11. The module according to claim 10, wherein a portion of the one or more second members that faces a region sandwiched between the first and second slopes obliquely opposing to each other has a light-reflecting property.

12. The module according to claim 10, wherein
the solar cell device includes:
a belt-like light-transmitting substrate having first and second major surfaces, the first major surface including first and second regions each extending in a longitudinal direction of the light-transmitting substrate and arranged in a width direction of the light-transmitting substrate;
a back electrode opposing the first region;
a light-transmitting front electrode including an electrode body interposed between the first region and the back electrode, and a terminal portion positioned above the second region and electrically connected to the electrode body; and
a active layer interposed between the back electrode and the electrode body, and
the support structure further includes first contact electrodes in contact with the back electrode at positions of the first portions, and second contact electrodes in contact with the terminal portion at the positions of the first portions.

13. The module according to claim 9, wherein the support structure comprises a member having grooves, and edges of the first portions that correspond to one of the long sides are inserted in the grooves.

14. The module according to claim 13, wherein the edges of the first portions are inserted into the grooves in one-to-one correspondence.

15. The module according to claim 14, wherein a portion of the member that is positioned between two of the grooves adjacent to each other and faces a region sandwiched between the first and second slopes obliquely opposing to each other has a light-reflecting property.

16. The module according to claim 13, wherein each pair of the first portions adjacent to each other have edges inserted in the same groove.

17. The module according to claim 13, wherein
the solar cell device comprises:
a belt-like light-transmitting substrate having first and second major surfaces, the first major surface including first and second regions each extending in a longitudinal direction of the light-transmitting substrate and arranged in a width direction of the light-transmitting substrate;
a back electrode facing the first region;
a light-transmitting front electrode including an electrode body interposed between the first region and the back electrode, and a terminal portion positioned above the second region and electrically connected to the electrode body; and
a active layer interposed between the back electrode and the electrode body, and
wherein the support structure further includes first contact electrodes in contact with the back electrode in the grooves, and second contact electrodes in contact with the terminal portion in the grooves.

18. The module according to claim 9, wherein a channel through which a refrigerant flows is provided in a region of the support structure that is sandwiched between the first and second slopes opposing back to back.

19. A solar cell module comprising:
a solar cell device including first portions arranged in a row in a first direction and inclining alternately toward the first direction and a second direction opposite to the first direction, and second portions arranged in two rows in a staggered configuration, the two rows of the second portions extending in the first direction and sandwiching the row of the first portions, the second portions in one of the two rows connecting pairs each including adjacent two of the first portions, and each of the second portions in the other of the two rows connecting two first portions of each pair; and a support structure supporting the solar cell device.

* * * * *